United States Patent
Novak et al.

(10) Patent No.: US 9,679,741 B2
(45) Date of Patent: Jun. 13, 2017

(54) ENVIRONMENTAL CELL FOR CHARGED PARTICLE BEAM SYSTEM

(75) Inventors: Libor Novak, Brno (CZ); Marek Uncovsky, Brno (CZ); Milos Toth, Portland, OR (US); Martin Cafourek, Brno (CZ); William Parker, San Jose, CA (US); Marcus Straw, Portland, OR (US); Mark Emerson, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 447 days.

(21) Appl. No.: 12/942,201

(22) Filed: Nov. 9, 2010

(65) Prior Publication Data

US 2012/0112062 A1 May 10, 2012

(51) Int. Cl.
*G01N 23/00* (2006.01)
*H01J 37/20* (2006.01)
*H01J 37/18* (2006.01)
*H01J 37/244* (2006.01)

(52) U.S. Cl.
CPC .............. *H01J 37/20* (2013.01); *H01J 37/18* (2013.01); *H01J 37/244* (2013.01); *H01J 2237/024* (2013.01); *H01J 2237/2001* (2013.01); *H01J 2237/2003* (2013.01); *H01J 2237/2445* (2013.01)

(58) Field of Classification Search
CPC .......... H01J 37/00; H01J 37/02; H01J 37/023; H01J 37/026; H01J 37/073; H01J 37/09; H01J 37/16; H01J 37/18; H01J 37/20
USPC ................. 250/306, 307, 311, 441.11, 443.1
See application file for complete search history.

(56) References Cited

U.S. PATENT DOCUMENTS

| 4,241,259 A | 12/1980 | Feuerbaum et al. |
| 4,605,566 A | 8/1986 | Matsui et al. |
| 4,785,182 A | 11/1988 | Mancuso et al. |

(Continued)

FOREIGN PATENT DOCUMENTS

| CN | 101545874 B | 9/2013 |
| EP | 1003200 | 5/2000 |

(Continued)

OTHER PUBLICATIONS

Bouldin, C.E., et al., 'Conversion-Electron Extended X-Ray-Absorption Fine-Structure Measurements of Ion-Damaged GaAs,' Physical Review B, Jan. 15, 1987, pp. 1429-1432, vol. 35, No. 3.

(Continued)

*Primary Examiner* — Jason McCormack
(74) *Attorney, Agent, or Firm* — Scheinberg & Associates, P.C.; Michael O. Scheinberg

(57) ABSTRACT

An environmental cell for a charged particle beam system allows relative motion between the cell mounted on an X-Y stage and the optical axis of the focusing column, thereby eliminating the need for a sub-stage within the cell. A flexible cell configuration, such as a retractable lid, permits a variety of processes, including beam-induced and thermally-induced processes. Photoelectron yield spectroscopy performed in a charged particle beam system and using gas cascade amplification of the photoelectrons allows analysis of material in the cell and monitoring of processing in the cell. Luminescence analysis can be also performed using a retractable mirror.

40 Claims, 10 Drawing Sheets

(56) References Cited

U.S. PATENT DOCUMENTS

| | | | |
|---|---|---|---|
| 4,823,006 A | 4/1989 | Danilatos et al. | |
| 4,897,545 A | 1/1990 | Danilatos | |
| 4,911,103 A * | 3/1990 | Davis | C23C 16/54 118/715 |
| 5,250,808 A | 10/1993 | Danilatos et al. | |
| 5,342,448 A | 8/1994 | Hamamura et al. | |
| 5,362,964 A | 11/1994 | Knowles et al. | |
| 5,397,956 A | 3/1995 | Araki et al. | |
| 5,412,211 A | 5/1995 | Knowles | |
| 5,440,124 A | 8/1995 | Kelly et al. | |
| 5,466,936 A | 11/1995 | Kohama et al. | |
| 5,493,125 A * | 2/1996 | Okayama | H01J 37/18 250/441.11 |
| 5,523,577 A | 6/1996 | Schonberg et al. | |
| 5,563,411 A * | 10/1996 | Kawata et al. | 850/9 |
| 5,683,547 A | 11/1997 | Azuma et al. | |
| 5,828,064 A | 10/1998 | Knowles | |
| 5,945,672 A | 8/1999 | Knowles et al. | |
| 6,025,592 A | 2/2000 | Knowles et al. | |
| 6,031,235 A * | 2/2000 | Ishida et al. | 250/441.11 |
| 6,303,932 B1 | 10/2001 | Hamamura et al. | |
| 6,365,898 B1 | 4/2002 | Sudraud et al. | |
| 6,440,615 B1 | 8/2002 | Shimizu | |
| 6,674,076 B1 | 1/2004 | Orfino et al. | |
| 6,686,590 B2 | 2/2004 | Ogawa | |
| 6,753,538 B2 | 6/2004 | Musil et al. | |
| 6,809,322 B2 | 10/2004 | Danilatos | |
| 6,936,817 B2 | 8/2005 | Feuerbaum | |
| 6,972,412 B2 | 12/2005 | Scholtz et al. | |
| 6,979,822 B1 | 12/2005 | Stewart et al. | |
| 7,015,467 B2 * | 3/2006 | Maldonado et al. | 250/306 |
| 7,241,993 B2 | 7/2007 | Nakasuji et al. | |
| 7,304,302 B1 | 12/2007 | Nunan et al. | |
| 7,374,701 B2 | 5/2008 | Hwang et al. | |
| 7,411,191 B2 | 8/2008 | Nakasuji et al. | |
| 7,456,413 B2 | 11/2008 | Buijsse et al. | |
| 7,482,603 B2 | 1/2009 | Tomimatsu et al. | |
| 7,989,782 B2 | 8/2011 | Tomimatsu et al. | |
| 8,053,726 B2 | 11/2011 | Nakasuji et al. | |
| 2003/0178582 A1 * | 9/2003 | Norioka | H01J 37/18 250/492.3 |
| 2005/0000937 A1 | 1/2005 | Chiang et al. | |
| 2005/0011457 A1 | 1/2005 | Chiang et al. | |
| 2005/0035306 A1 * | 2/2005 | Iwasaki | H01J 37/20 250/492.2 |
| 2005/0158653 A1 | 7/2005 | Hatakeyama et al. | |
| 2005/0173644 A1 | 8/2005 | Gnauck et al. | |
| 2005/0178966 A1 * | 8/2005 | Gross | 250/311 |
| 2005/0190310 A1 | 9/2005 | Koyama et al. | |
| 2006/0011834 A1 | 1/2006 | Nishimura et al. | |
| 2006/0046042 A1 | 3/2006 | Drzal et al. | |
| 2006/0228634 A1 | 10/2006 | Bret et al. | |
| 2007/0023655 A1 * | 2/2007 | Nishikata | H01J 37/228 250/310 |
| 2007/0176102 A1 | 8/2007 | Slingerland et al. | |
| 2008/0027676 A1 * | 1/2008 | Statham | G01J 3/28 702/179 |
| 2008/0185509 A1 * | 8/2008 | Knowles | 250/251 |
| 2008/0265159 A1 * | 10/2008 | Hatakeyama et al. | 250/310 |
| 2008/0308729 A1 * | 12/2008 | Kimba | G01N 23/225 250/307 |
| 2008/0308742 A1 | 12/2008 | Gerlach et al. | |
| 2009/0152460 A1 * | 6/2009 | Buhler et al. | 250/306 |
| 2009/0166557 A1 * | 7/2009 | Makino et al. | 250/442.11 |
| 2009/0242758 A1 * | 10/2009 | Uncovsky | H01J 37/244 250/307 |
| 2010/0133433 A1 * | 6/2010 | Tanimoto et al. | 250/310 |
| 2011/0006205 A1 * | 1/2011 | Browning | 250/305 |
| 2011/0031394 A1 * | 2/2011 | Knowles | H01J 37/301 250/307 |
| 2012/0091338 A1 | 4/2012 | Buijsse | |

FOREIGN PATENT DOCUMENTS

| | | |
|---|---|---|
| EP | 1724809 | 11/2006 |
| GB | 2186737 | 8/1987 |
| JP | 963527 | 7/1979 |
| JP | 6365952 | 4/1988 |
| JP | 3273134 | 12/1991 |
| JP | 6265952 | 9/1994 |
| JP | H06289299 | 10/1994 |
| JP | H780273 | 3/1995 |
| JP | 10172487 | 6/1998 |
| JP | 2000215842 | 8/2000 |
| JP | 2000304712 | 11/2000 |
| JP | 2002214091 | 7/2002 |
| JP | 2003308801 | 10/2003 |
| JP | 2005174591 | 6/2005 |
| JP | 2005190864 | 7/2005 |
| JP | 2005523459 | 8/2005 |
| JP | 2006100038 | 4/2006 |
| JP | 2006234789 | 9/2006 |
| JP | 2007172886 | 7/2007 |
| JP | 2008165990 | 7/2008 |
| JP | 2009187928 | 8/2009 |
| JP | 2009245939 | 10/2009 |
| JP | 2010518583 | 5/2010 |
| WO | 2008098084 | 8/2008 |
| WO | 2010006188 | 1/2010 |

OTHER PUBLICATIONS

Elam, W.T., et al., 'Depth Dependence for Extended X-Ray-Absorption Fine-Structure Spectropscopy Detected via Electron Yield in He and In Vacuum,' Physical Review B, Jul. 1, 1988, pp. 26-30, vol. 38, No. 1.

Honda, Masato, et al., 'Atmospheric Effect of Air, N2, O2, and Water Vapor on the Ionization Energy of Titanyl Phthalocyanine Thin Film Studied by Photoemission Yield Spectroscopy,' Journal of Applied Physics, 2007, 10 pgs., vol. 102.

Kordesch, M.E., et al., 'Electron-Yield Extended X-Ray Absorption Fine Structure with the use of a Gas-Flow Electron Detector,' Physical Review B, Jan. 1, 1984, pp. 491-492, vol. 29, No. 1.

Long, G.G., et al., 'Surface-Extended X-Ray-Absorption Fine-Structure Experiments at Atmospheric Pressure by means of a Photocathode Proportional Counter with Monolayer Sensitivity,' Physical Review B, May 15, 1989, pp. 10651-10657, vol. 39, No. 15.

European Office Action for Appl. No. 11187989.6 dated Jan. 28, 2013.

European Office Action for Appl. No. 11187990.4 dated Jan. 28, 2013.

Japanese Office Action, dated Nov. 14, 2012, 6 pages.

Sung, Myung M., et al., "Chemical-beam deposition of GaN films on Si(111) from diethylazidogallium methylhydrazine adduct." J.Vac. Sci. Technol., Apr. 5, 2004, pp. 461-465, vol. 22, No. 3.

* cited by examiner

ENVIRONMENTAL CELL FOR CHARGED PARTICLE BEAM SYSTEM

TECHNICAL FIELD OF THE INVENTION

The present invention relates to charged particle beam systems, and in particular, to charged particle beam systems that allow a work piece to be processed in a reactive gaseous environment.

BACKGROUND OF THE INVENTION

In a scanning electron microscope ("SEM"), a primary beam of electrons is scanned upon a region of a sample that is to be investigated. The energy released in the impact of the electrons with the sample causes the liberation of other charged particles in the sample. The quantity and energy of these secondary particles provide information on the nature, structure and composition of the sample. The term "sample" is traditionally used to indicate any work piece being processed or observed in a charged particle beam system and the term as used herein includes any work piece and is not limited to a sample that is being used as a representative of a larger population. The term "secondary electrons" as used herein includes backscattered primary electrons, as well as electrons originating from the sample. To detect secondary electrons, a SEM is often provided with one or more secondary electron detectors.

In a conventional SEM, the sample is maintained in a high vacuum to prevent scattering of the primary electron beam by gas molecules and to permit collection of the secondary electrons. However, wet samples such as biological samples are not suitable for observation in a high vacuum. Such samples experience evaporation of their fluid content in the vacuum before an accurate image can be obtained, and the evaporated gas interferes with the primary electron beam. Objects that outgas, that is, solids that lose gas at high vacuum, also require special consideration.

Electron microscopes that operate with the sample under a relatively high pressure are described, for example, in U.S. Pat. No. 4,785,182 to Mancuso et al., entitled "Secondary Electron Detector for Use in a Gaseous Atmosphere." Such devices are better known as High Pressure Scanning Electron Microscopes (HPSEM) or Environmental Scanning Electron Microscopes. An example is the Quanta 600 ESEM® high pressure SEM from FEI Company.

In an HPSEM, the sample that is to be investigated is placed in an atmosphere of a gas having a pressure typically between 0.1 Torr (0.13 mbar) and 50 Torr (65 mbar), and more typically between 1 Torr (1.3 mbar) and 10 Torr (13 mbar), whereas in a conventional SEM the sample is located in vacuum of substantially lower pressure, typically less than $10^{-5}$ Torr ($1.3 \times 10^{-5}$ mbar). The advantage of an HPSEM as compared to a conventional SEM is that the HPSEM offers the possibility of forming electron-optical images of moist samples, such as biological samples, and other samples that, under the high vacuum conditions in a conventional SEM, would be difficult to image. An HPSEM provides the possibility of maintaining the sample in its natural state; the sample is not subjected to the disadvantageous requirements of drying, freezing or vacuum coating, which are normally necessary in studies using conventional SEMs and which can alter the sample. Another advantage of an HPSEM is that the ionized imaging gas facilitates neutralization of electrical charges that tend to build up in insulating samples, such as plastics, ceramics or glass.

In an HPSEM, secondary electrons are typically detected using a process known as "gas ionization cascade amplification" or "gas cascade amplification," in which the secondary charged particles are accelerated by an electric field and collide with gas molecules in an imaging gas to create additional charged particles, which in turn collide with other gas molecules to produce still additional charged particles. This cascade continues until a greatly increased number of charged particles are detected as an electrical current at a detector electrode. In some embodiments, each secondary electron from the sample surface generates, for example, more than 20, more than 100, or more than 1,000 additional electrons, depending upon the gas pressure and the electrode configuration.

An HPSEM limits the region of high gas pressure to a sample chamber by using a pressure-limiting aperture (PLA) to maintain a high vacuum in the focusing column. Gas molecules scatter the primary electron beam, and so the pressure limiting aperture is positioned to minimize the distance that the primary electron beam travels in the high pressure region in order to reduce interference with the primary beam, while providing a sufficient travel distance between the sample and the detector for adequate gas cascade amplification of the secondary electron signal.

An HPSEM as described in U.S. Pat. No. 4,785,182 comprises a vacuum envelope having a pressure limiting aperture, an electron beam source located within the vacuum envelope and capable of emitting electrons, one or more focusing lenses located within the vacuum envelope and capable of directing an electron beam emitted by the electron source through the pressure limiting aperture, beam deflectors located within the vacuum envelope and capable of scanning the electron beam, and a sample chamber including a sample platform disposed outside the high vacuum envelope and capable of maintaining a sample enveloped in a gas at a desired pressure.

While an HPSEM can observe moist biological samples, problems still exist with such observations. For example, when hydrated materials are observed at room or body temperature, water tends to condense on all surfaces within the sample chamber. Such condensation can interfere with the operation of HPSEM, as well as cause corrosion and contamination.

Charged particle beams, such as electron beams or ion beams, can also be used to induce a chemical reaction to etch a sample or to deposit material onto a sample. Such processes are described, for example, in U.S. Pat. No. 6,753,538 to Musil et al. for "Electron Beam Processing." The process of a charged particle beam interacting with a process gas in the presence of a substrate to produce a chemical reaction is referred to as "beam chemistry." The term "processing" as used herein includes both processing that alters the sample surface, such as etching and deposition, as well as imaging. The term "processing gas" is used to include a gas that is used for imaging or a gas that is used together with the charged particle beam to alter the sample. The term "imaging gas" is used to include a gas that is used primarily for imaging. The classes of gasses are not mutually exclusive, and some gasses may be used for both altering the sample and for forming an image. For example, water vapor can be used to etch a sample that includes carbon. Water vapor can also be used to form an image of samples that include other materials.

Conventional HPSEMs are not well adapted for efficient beam chemistry. One problem with using a HPSEM system for beam chemistry is the presence of impurities such as $H_2O$ inside the sample chamber. Beam chemistry typically involves a three step procedure that precedes processing. First, the sample chamber is pumped to high vacuum whereby the chamber pressure is lower than $10^{-5}$ mbar using a high vacuum pump such as a turbomolecular pump backed by a roughing pump such as a scroll pump. Second, the sample chamber is isolated from the high vacuum pump, and third, the chamber is filled with a precursor gas used for beam chemistry. For example, $WF_6$ and $Pt(PF_3)_4$ are used for electron beam-induced deposition of materials that contain W and Pt, respectively, and $XeF_2$ is used to etch materials such as $SiO_2$ and Cr. A problem with this approach is that the second and third steps and subsequent beam chemistry process steps cause an increase in the concentration of gaseous impurities such as $H_2O$ inside the sample chamber up to a pressure well above the initial base pressure of $10^{-5}$ mbar. This increase in impurity concentration is the result of a dramatic reduction in the pumping rate of the chamber caused by the above step 2. The impurities are introduced by desorption from surfaces inside the sample chamber, and diffusion through o-rings typically used on SEM and HPSEM chambers. In a typical chamber, the pressure of background impurities will increase from the high vacuum base pressure of less than $10^{-5}$ mbar to a HPSEM base pressure greater than $10^{-3}$ mbar. The exact HPSEM base pressure is a function of the inner surface area of the chamber, the number and size of o-rings used to isolate the chamber from laboratory atmosphere, and the size of the pressure limiting aperture that restricts the pumping speed of the HPSEM sample chamber through the differentially pumped electron optical column. The impurities are comprised primarily of $H_2O$, $N_2$ and $O_2$ and do not interfere with historically conventional HPSEM operation which entails filling the chamber with a gas such as $H_2O$ vapor for the purpose of charge control and stabilization of vacuum-incompatible samples. The impurities do, however, interfere with beam chemistry because molecules such as $H_2O$ and $O_2$ react with and cause the decomposition of deposition and etch precursors such as most organometallics, $WF_6$, $MoF_6$, $Pt(PF_3)_4$, $XeF_2$, $F_2$ and $Cl_2$. The impurities also occupy surface sites at the sample surface thereby reducing the adsorption rate of precursor molecules used for beam chemistry; and cause the oxidation of materials such as W and Mo during deposition and thereby alter the composition and functional properties of the deposited material. The HPSEM base pressure can be decreased by increasing the size of the pressure limiting aperture between the sample chamber and the electron optical column. This is, however, undesirable as it increases the gas flow rate into the column and decreases the maximum usable sample chamber pressure. The HPSEM base pressure can also be decreased by pumping the sample chamber using a roughing pump such as a scroll pump. This, however, is also undesirable as it increases the consumption and exhaust rates of precursor gases, which are often expensive and toxic, and reduces the lifetime of the roughing pump. The HPSEM base pressure can also be decreased using techniques employed in ultra-high vacuum technologies, such as the use of knife-edge metal-to-metal vacuum seals in place of o-rings, and baking of the sample chamber prior to analysis. These approaches are, however, incompatible with the cost and flexibility expected of commercial variable pressure SEM (VPSEM) systems.

Another problem with using a HPSEM system for beam chemistry is the considerable time required to introduce and evacuate gases from the sample chamber. The sample chamber in a conventional HPSEM includes a gas inlet through which a gas is introduced by way of a leak valve. The gas then migrates throughout the sample chamber. Some of the gas molecules escape through the PLA into the column, where they are removed by a vacuum pump that maintains the column at a low pressure. The inlet leak valve is adjusted so that a desired equilibrium pressure is achieved, with the gas escaping through the PLA into the column just matching the gas introduced through the leak valve. The HPSEM typically begins processing a sample only after equilibrium is achieved. It takes a considerable amount of time for the gas to reach an equilibrium pressure, particularly if the vapor pressure of the beam chemistry precursor is similar to the desired operating pressure of the sample chamber. For a large sample chamber volume of 30 liters, such as that used in a common HPSEM and dual beam systems, it can take up to 30 minutes for the partial pressure of the process gas to reach equilibrium. A "dual beam" system employs two beams, such as an electron beam and an ion beam, implemented on a single sample chamber.

The above problem is compounded when a process entails injecting multiple process gases into the sample chamber. Typically, there is a pressure gauge downstream of the needle valve on the sample chamber side. The pressure gauge typically measures the total pressure in the sample chamber and is incapable of separately measuring the partial pressures of multiple process gases in a mixture. Thus, it is difficult to know when the desired partial pressure of each of the gases has been achieved.

When performing beam chemistry processing in a conventional SEM, focused ion beam (FIB), or dual beam system, the system operator will typically obtain a charged particle beam image of the sample to navigate to an area that is to be processed by etching or depositing material. After performing the beam processing operation, the operator will typically obtain another charged particle beam image of the sample to evaluate the results of the process. Because different gases are typically used to process and image in an HPSEM, the sequence of image, process, and image would require multiple changes of the gas in the chamber. If some process gas remains in the chamber during imaging, the sample may be unintentionally modified by the beam during the imaging operation. Because of the considerable time required to fully evacuate one gas and then to reach equilibrium pressure with another gas, such multiple step operations are not practical in an HPSEM. The processing time is further increased in some cases because the molecules of some gases used in beam chemistry tend to have very long residence times on the chamber walls, and take longer to fully evaporate and to be removed from the sample chamber.

Another reason why HPSEMs are not generally used for beam chemistry is that corrosive process gases can degrade the HPSEM components. For example, certain process gases associated with beam chemistry can react spontaneously with components such as plastic tubing and are very dangerous to human health. Gases like $XeF_2$ and $MoF_6$ can make plastic gas tubing brittle and eventually cause leaks of dangerous gases into the surrounding environment.

The gaseous environment of a HPSEM sample chamber enables real-time SEM studies of dynamic processes in which a sample is modified through thermal annealing in the presence of a reactive gas. For example, a sample such as iron or steel can be oxidized by heating the sample to a high temperature (e.g., 850° C.) in an $O_2$ environment, causing microstructural changes that can be imaged in real time during oxidation. However, the range of studies that can be performed in a HPSEM is limited by the abovementioned impurities, such as $H_2O$ and $O_2$, which are responsible for the VPSEM base pressure. These impurities inhibit sample modification processes like heat-induced reduction caused by a reducing gas like $H_2$ and many forms of chemical vapor deposition (CVD) due to unintended reactions between the impurities and the sample, or the impurities and the process precursor molecules.

PCT/US2008/053223, which is assigned to the assignees of the present application and which is hereby incorporated by reference, describes several configurations of environmental cells that allow HPSEM operation while solving some of the problems described above. By "environmental cell" is meant an enclosure for providing an environment around the sample, typically a different environment than that present in a sample chamber in which the environmental cell is located. An environmental cell can solve some of the above problems by enhancing control of the sample environment, reducing the concentration of gaseous impurities present during HPSEM processing, and reducing the volume and inner surface area of the HPSEM process chamber. Embodiments of the present invention include design improvements to the environmental cell methodology to reduce cost and engineering complexity, and expand the usefulness of HPSEM for the investigation and application of beam chemistry and heat-induced gas-mediated processes such as oxidation, reduction and CVD. The improvements include improved control of the sample environment, facilitation of complementary "correlative" sample analysis techniques for studies and application of HPSEM beam chemistry and heat-induced gas-mediated processes, and a reduction in the number of materials that must be employed inside an environmental cell and consequent chemical incompatibilities between the materials and process precursors.

SUMMARY OF THE INVENTION

An object of the invention is to facilitate processing and/or analyzing a sample in a charged particle beam system capable of providing a controlled environment.

In accordance with a preferred embodiment of the invention, a cell is provided that allows the sample to be processed in a gaseous environment. In some embodiments, the environmental cell can be configured so that a sample can also be processed or analyzed in a high vacuum environment, and multiple types of processing and analyses can be performed in the same instrument. Process and analysis techniques available in various embodiments may include, for example, one or more of the following: high vacuum and HPSEM electron beam chemistry, focused ion beam milling and chemistry; and x-ray, cathodoluminescence, photoluminescence and photoelectron yield spectroscopy.

In one embodiment, a cell is comprised of two parts, and upper part that is fixed relative to the electron beam column and contains a pressure limiting aperture that restricts gas flow into the column, and a lower part which is mounted on a moveable stage of a conventional high vacuum charged particle beam system. A sliding contact seal between the upper and lower parts of the cell allows relative movement between the lower and upper parts. Stage translation in the plane normal to the electron beam axis enables sample navigation without the need for a sub-stage inside the cell, and translation along the beam axis enables rapid switching of the cell environment to that of the surrounding vacuum chamber by opening the sliding contact seal to enable more rapid pumping of the cell interior. The axial motion of the lower part of the cell away from the upper part and the column also frees up space between the sample and the column, enabling the insertion of a device such as a parabolic mirror between the sample and the column, thereby enabling analysis of a sample by techniques such as cathodoluminescence and photoluminescence spectroscopy before and after processing in the gaseous environment of the cell. In some embodiments, the upper part of the cell is mounted on a retraction mechanism which can retract the upper part thereby freeing up further space around the sample, enabling the insertion of devices such as a gas injection capillary to deliver a process gas to a small region of a sample in a high vacuum process chamber, or an x-ray collector used for x-ray analysis of the sample. Embodiments of the invention enable flexible, rapid processing and analysis without exposing the sample to the laboratory atmosphere, without vacuum transfer devices that slow down process workflow and increase cost and complexity, and without the need to make high vacuum process and analysis devices compatible with the chemically aggressive environments encountered in the cell.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
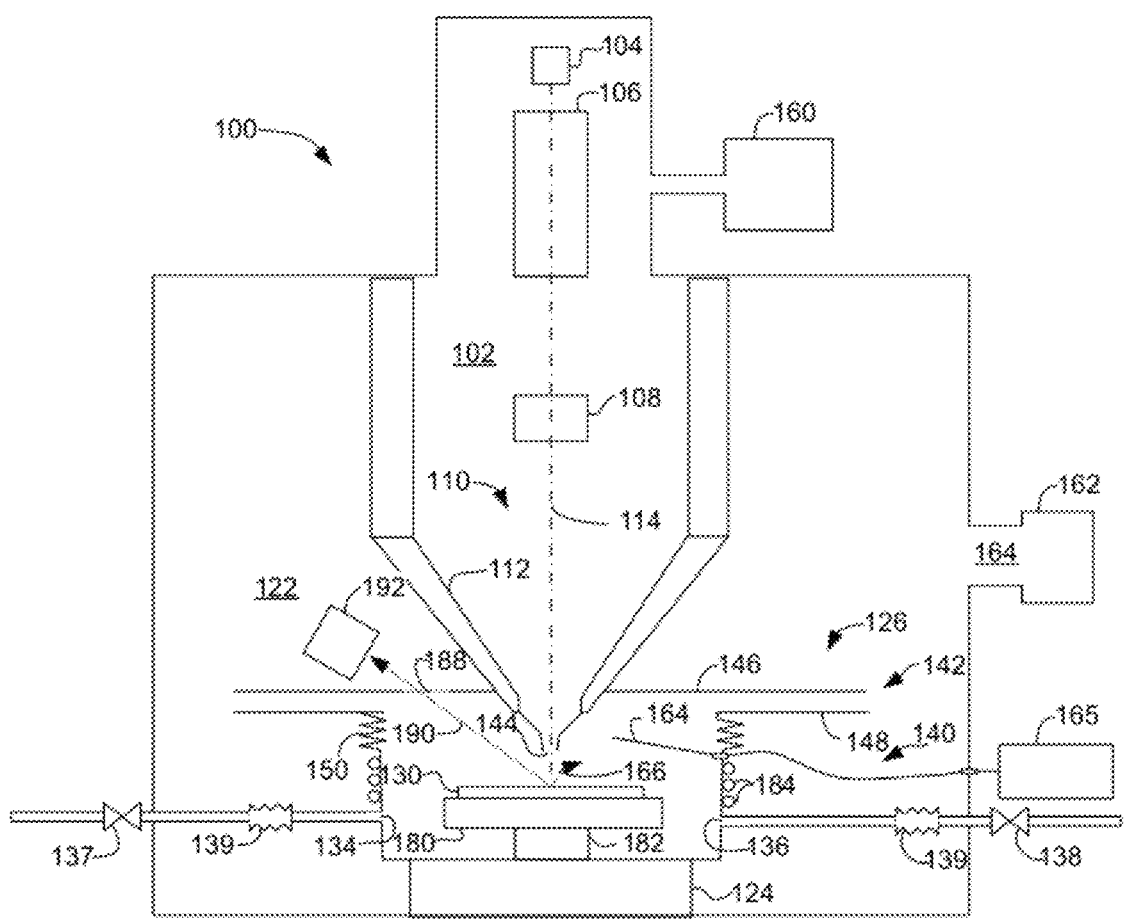
FIG. 1 shows an embodiment of a charged particle beam system of the present invention having an environmental cell.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

One aspect of embodiments of the present invention is a charged particle beam system that provides for processing a sample in a gaseous environment. Various embodiments of the invention may provide additional capabilities. In one embodiment, the invention provides an environmental cell for processing a work piece in a relatively high pressure in a charged particle beam system. The cell environment may include one or more gas inlets and outlets and a secondary electron detector that uses gas ionization cascade amplification. In some embodiments, the cell is configurable to remove cell portions, such as a cell lid or one or more cell walls, to facilitate various types of processing or analysis and flexible process workflows in addition to high pressure scanning electron microscopy.

One preferred embodiment includes a gas seal that allows an environmental cell mounted on a sample stage to be moved independently of the pressure limiting aperture that maintains a higher pressure in the cell than in the charged particle beam column. The environmental cell can preferably be moved without changing the alignment between the charged particle beam system optical axis and the pressure limiting aperture. Because the cell with the sample can be moved relative to the beam, some embodiments do not require a sub-stage, as those described in PCT/US2008/053223, within the cell to move the sample relative to the beam. Eliminating the sample sub-stage reduces cost and complexity, and enhances cell performance by enhancing control over the sample environment for at least three reasons. First, it facilitates the use of process gases, such as corrosive gases, that are incompatible with some stage movement mechanisms. Second, it makes it possible to reduce the cell inner volume and the area of surfaces exposed to process gases, thereby enabling more rapid evacuation and switching of process gases. Third, it increases the efficiency with which gaseous impurities can be removed from the sample environment by baking of the cell, heater and the sample prior to processing. The baking temperature is limited by the heat tolerance of the cell components, and the sub-stage of the cells described in PCT/US2008/053223 is typically the most heat-intolerant component of the system.

Preferred embodiments of the environmental cell enable not only charged particle beam-induced local reactions in the gaseous environment of the cell, but also enable thermal processing, such as chemical vapor deposition, catalysis, oxidation, reduction, and surface passivation, inside of a scanning electron microscope or dual beam instrument. Thermal processing can either be global or local. "Global processing" refers to processing that occurs over the entire sample or over the majority of the sample surface, whereas "local processing" refers to processes that occur over an area of square millimeters, square microns, or even smaller areas as determined by the presence of reactants, catalysts or of the energy to initiate a reaction. For example, a catalytic seed such as an Au colloid can localize a thermally driven gas-mediated process such as CVD of Si. In another example, a charged particle beam or laser may provide energy for a local reaction with a process gas distributed throughout the environmental cell or a local application of a gas reactant by a capillary may provide reactant to a globally heated sample. Examples of global processes include distributing a gas throughout the environmental cell and heating a sample to induce oxidation or reduction of the sample surface, CVD of a film at the sample surface or dry etching of the sample surface.

In some embodiments, the relative motion between the cell and the column is facilitated by constructing the cell in two parts: a cell body portion mounted onto the sample stage of an SEM or a dual beam system and a lid portion mounted to or just below the pole piece of the SEM objective lens, the lid including a pressure limiting aperture (PLA). The PLA is centered with respect to the electron beam axis. The cell body is mounted to the charged particle beam stage and contains a sample. A seal between the lid portion and the body portion permits relative motion between the two. In one embodiment, the seal is a sliding contact friction seal, whereby the upper surface of the cell body includes a flange having a smooth surface finish suitable for sealing with a mating surface on the lid. A gas seal is formed by contacting the cell body flange with the lid surface, for example, by raising the charged particle beam stage along its z-axis which is parallel to the electron beam axis. The height of the stage is adjusted to produce an adequate seal which can be a contact seal or a small gap that restricts the gas flow rate from the cell into the enclosing chamber. The flat surfaces of the flange and the lid can seal with or without the use of an elastomer. While stainless steel and aluminum have been shown to produce an adequate contact seal, other metallic and non-metallic sealing materials, such as fluoropolymers, such as polytetrafluoroethylene (PTFE), and nitrile and silicone rubbers, can be used. The sealing materials should not only create an adequate seal, they should be compatible with process gases that will be used in the cell, and cell body operating temperatures. The seal does not need to be absolutely gas tight; some gas leakage occurs, and the gas escaping into the enclosing chamber is pumped out by a vacuum pump. The x and y axes of the stage are used to translate the cell body and therefore the sample in a plane normal to the z-axis when the cell is sealed.

In some embodiments, the cell body includes a flexible portion, such as a compressible bellows, that enables limited z-translation of the sample, typically a few millimeters, as well as movement in the x-y plane. The bellows have sufficient stiffness to provide enough pressure between the lid sealing surface and the cell body sealing surface to maintain an adequate contact seal, while still allowing smooth relative motion between the cell and the lid. The bellows may also reduce the transmission of mechanical vibration into the SEM column. Mechanical support may be provided to the environmental cell to prevent tipping or moving relative to the stage.

In some embodiments, the cell can contain an x-ray transparent window to enable x-ray analysis of the sample, during or after processing, without breaking vacuum, that is, without opening the sample chamber and exposing the sample to laboratory atmosphere. The window can be made from a metal such as beryllium or a polymer such as polyimide, and can be embedded into the lid of the cell. An x-ray focusing optic can be placed inside the SEM chamber and preferably outside the environmental cell to increase the solid detection angle of an x-ray detector.

In some embodiments, a portion of the environmental sample cell can be reconfigured so that the microscope can be operated in a high vacuum mode and to provide access to the sample for various types of processes and analytic techniques. In some embodiments, the lid is retractable. For example, the lid can be mounted on a retractable arm located inside the charged particle beam chamber. A retractable lid also allows the use of charged particle beam assisted etching or deposition using a capillary of a known gas injection system ("GIS") to locally deliver the gas while the rest of the sample is at a relatively low pressure, instead of filling the cell with a gas. With the lid retracted, additional processing and analyses can be performed, including high vacuum techniques that can not be implemented within a sealed cell without reducing the usefulness of these techniques and/or of the cell. For example, in a dual beam system, the sample can be processed by a focused ion beam with the lid retracted without having to "break vacuum," that is, without exposing the sample chamber to the atmosphere. A retractable lid also enables multi-step processes that require vent-free (that is, without "breaking vacuum") switching between in-cell operation in a gaseous environment, high vacuum focused ion beam or electron beam processes, and high vacuum thermal gas chemistry processes in which the gas is delivered to a sample locally using a capillary. The latter processes less than the entire sample, but processes a larger area than typical charged particle beam processing, and enables the use of low vapor pressure precursors that are unsuitable for use in an environmental cell. A retractable lid facilitates the use of a radiation detector for detecting radiation emitted from the sample upon impact of the electron beam, such as an x-ray detector for detecting x-rays for x-ray analysis or a photon detector for detecting light for luminescence analysis. A retractable lid facilitates the use of techniques such as cathodoluminescence, photoluminescence and x-ray analysis of the sample without breaking the vacuum. While x-ray analysis can be performed through an x-ray transparent window in the cell, retracting the lid allows the sensor to be placed closer to the sample, thereby increasing the solid angle of collection of the x-ray detector. Furthermore, an x-ray window reduces the efficiency of the detection system because it must be constructed so as to trade off conflicting requirements: the window must have high x-ray transparency, but it must also be sufficiently robust to withstand cell body temperatures and contact with reactive gases employed during normal cell operation. A retractable cell lid also facilitates the use of known, high efficiency cathodoluminescence analysis systems. A high efficiency cathodoluminescence system typically employs a retractable parabolic or elliptical mirror that is placed between the sample and the SEM column during cathodoluminescence detection. The mirror maximizes the solid angle of collection and hence efficiency of the cathodoluminescence system. A mirror retraction mechanism eliminates mirror interference with sample imaging and manipulation processes performed before and after cathodoluminescence analysis. In addition to cathodoluminescence, a mirror can also be used for high efficiency photoluminescence, where the photons emitted from a sample are excited by photons rather than electrons. Cathodoluminescence has the disadvantage of a high spatial resolution that is not attainable by photoluminescence.

In some embodiments, one or more the walls of the environmental cell can be retracted or otherwise moved out of the way to provide access to the sample for processing or analysis.

In some embodiments, the cell may also contain a sample heater that preferably exhibits minimal outgassing during high temperature sample processing. Outgassing entails the emission of molecules such as $H_2O$ from the heater which can contaminate the gaseous environment that is used to process a sample at high temperature. To minimize outgassing during processing the heater and the sample may be pre-heated in a high vacuum environment or in the presence of a flowing inert gas such as $N_2$ or Ar. In general, the effectiveness of such a "purification process" increases with temperature and time. For example, the sample and the heater may be heated to 250° C. for 2 hours, or to 100° C. for 10 hours. The heater may be an ultra-high-vacuum-rated heater comprised of a material such as Pyrolytic Boron Nitride (PBN). In some embodiments, the heater may be comprised of a material such as $Al_2O_3$ in order to increase heater lifetime in oxidizing gaseous environments. Embodiments of the cell that use a sample heater may also use liquid cooling of the cell walls and a cell lid to prevent heating of the cell and consequent heating of other components of the microscope such as the stage and the SEM column. A bellows between the cell walls and the flange can also be used to suppress vibrations caused by water cooling of the cell body. Water cooling may be turned off during a purification process step so as to enable radiative heating of the cell walls and desorption of contaminants such as $H_2O$ from the cell walls prior to sample processing in a reactive gaseous environment. In some embodiments, the cell body can be made such that it is separable from the cell base. In this configuration, a heater can be mounted to the cell base which is mounted onto the HPSEM stage. The cell base can then be used without the cell body, thereby enabling thermal gas chemistry in a conventional, high vacuum dual beam system equipped with a known capillary gas injection system. Thus, a single cell design enables both immersion- and localized gas-mediated heat-induced sample processing.

In some embodiments, the heater geometry may be made the same as the geometry of a cooling device such as a Peltier cooler so as to enable ergonomic replacement of a sample heater with a sample cooler. Cooling can be desirable in some instances, such as when the rate of a beam chemistry process is limited by precursor molecule adsorption time at the sample surface.

Some embodiment may employ a heat shield to minimize radiative heat transfer from the heater and the sample to the cell walls, cell lid and surrounding components such as electron detectors. The heat shield can surround the heater and the sample, and can contain an aperture for admitting an electron beam to a sample, and for admitting electrons emitted from the sample to a detector. U.S. Pat. No. 6,025,592 to Knowles for a "High Temperature Specimen Stage and Detector for an Environmental Scanning electron Microscope," which is assigned to the assignee of the present invention, describes a high temperature specimen stage having a heat shield. At very high sample temperatures, for example temperatures greater than 900° C., a bias of a few volts or few tens of volts may be applied to a metallic heat shield to prevent thermionic electrons from interfering with electron imaging signals. The bias may be positive or negative so as to collect thermionic electrons or direct them towards the sample surface, respectively. In either configuration, low energy secondary electrons are also suppressed by the biased heat shield and imaging can be done using high energy backscattered or transmitted electrons.

FIG. 1 shows schematically a preferred embodiment of the present invention. A charged particle beam system 100 includes a charged particle beam column 102 comprising a charged particle beam source 104, focusing optics 106, deflectors 108 and an objective lens 110 including a pole piece 112, all aligned on an optical axis 114. An evacuable sample chamber 122 includes a sample motion stage 124 containing a cell 126 for containing a sample 130. Stage 124 has at least a first translation or rotation axis and a second translation or rotation axis relative to the optical axis. The cell includes a gas inlet 134 for providing gas within the cell 126 and a gas outlet 136 for removing gas from the cell 126. A valve 137 provides control over the gas flow rate into the cell and a valve 138 provides control over flow out of the cell through outlet 136. The inlet 134 and outlet 136 may be comprised of a stainless steel bellows 139 that is flexible and compatible with process gases used in the cell and with x-y motion of the sample stage 124 relative to the sample chamber 122.

The cell 126 is comprised of a lower part 140 and an upper part 142. The upper part 142 is mounted onto pole piece 112 and includes a pressure-limiting aperture 144 that reduces the amount of gas flowing into the charged particle beam column 102 from the interior of cell 126. Gas flow restriction be achieved using a number of geometries such the hollow cone shown in FIG. 1, a tube or a membrane with a small opening. Cell upper part 142 includes a lid 146 that provides a sealing surface for sealing with a mating surface on a flange 148 on cell lower portion 140 to maintain gas within the interior of cell 126. The lower part 140 is supported on the sample stage 124. Sample stage 124 preferably has at least three degrees of freedom, that is, it can move in a plane (the "x-y" plane) normal to the charged optical axis 114 and can move up and down, parallel to the optical axis 114 (that is, along the "z" axis). Flange 148 is preferably connected to the rest of lower portion 140 by a flexible portion to allow vertical movement between the portion of the cell that is moveable with the stage and the portion of the cell that is fixed with respect to the particle optical column, such as an optional bellows 150. Flange 148 and lid 146 are preferably made of materials that are compatible with process gases and that can be finished to provide smooth sealing surfaces and provide resiliency to maintain contact between the sealing surfaces. Typically, flange 148 and lid 146 may be comprised of different materials to avoid the possibility of cold-welding in a high vacuum environment. For example, stainless steel maintains an adequate seal, and is compatible with most process gases. Other types of sliding seals, such as o-rings, can also be used. Bellows 150 provides sufficient vertical pressure between flange 148 and lid 146 to maintain an acceptable sliding contact seal while allowing movement in the x-y plane as well as height adjustments of the sample along the z-axis. A mechanical structure such as a clip, a clamp or a threaded rod can secure cell 126 to stage 124 to prevent tipping of the cell or relative movement between cell 126 and stage 124. Gas inlet 134 and outlet 136 may be connected to cell 126 using a fitting such as a threaded pipe fitting or a Swagelok® VCR® fitting to enable removal of cell 126 from chamber 122. Skilled persons will understand that a small amount of gas will exit through the pressure limiting aperture 144 into column 102. The gas will be removed by a vacuum pump 160, such as a scroll pump, a turbomolecular pump or an ion pump, or a number of such pumps may be connected to different parts of the column so as to create a steep pressure gradient between the source 104 and pressure-limiting aperture 144. Similarly, some gas will escape through the seal between flange 148 and lid 146 into sample chamber 122. That gas will be removed by a vacuum pump 162, such as a turbomolecular pump or a scroll pump. In some embodiments, the seal is not a contact seal, but rather a gap, preferably of less than 1 mm, between the flange and the lid. A disadvantage of a contact seal is that friction between flange 148 and lid 146 can interfere with translation of stage 124 in the x-y plane. A disadvantage of a gap seal is that the gas flow rate between cell 126 and chamber 122 increases with gap size.

Positioning the cell 126 on the sample stage 124 and allowing relative movement between cell 126 and the optical axis 114 eliminates the requirement for having a separate movable stage within cell 126. The two part gas seal allows the PLA 144 to be attached to the pole piece 112 so that it remains aligned with the optical axis 114 of the charged particle beam, while allowing the stage to be moved in the x-y plane to align the region of interest on the sample with the beam.

Fixing the position of the lid 146 with respect to the pole piece 112 and positioning the lower part 140 of the cell 126 using z motions of the stage 124 allows sealing and "opening" of the cell 126 by moving the lower part 140 along the z-axis. Opening the cell in this manner allows very efficient, rapid evacuation of the cell 126 by the vacuum pump 162. The pump 162 is typically a turbomolecular pump with a pumping speed of at least 150 liters/sec. Such a pump is typically larger than the cell 126 and can not be connected to the cell directly using a gas exhaust outlet such as 136 whilst maintaining a high pumping speed because the pumping speed is limited by the conductivity of the outlet 134. The pump 162 can, however, be connected to chamber 122 through a high conductivity opening 164, such as an opening with a diameter of at least 10 cm. Then, pump 162 can be used to evacuate cell 126 rapidly by opening the cell so as to create a gap, preferably greater than 1 cm, between the lid 146 and the flange 148.

A secondary electron detector comprises a conductive electrode 164 in the form of a needle that extends inward from a wall of cell 126 and is electrically isolated from the cell wall. A wire carries a signal from electrode 164 to an imaging controller 165. A charge on electrode 164 attracts secondary electrons 166 emitted from the sample 130. The difference in electrical potential between electrode 164 and sample 130 causes secondary electrons 166 from the sample to accelerate and collide with gas molecules, which in turn are ionized to free additional electrons which accelerate and ionize more gas molecules, thereby amplifying the secondary electron signal by way of a collision cascade. Alternative detectors could also be used (not shown), such as a ring shaped detector mounted on, and insulated from, the pressure limiting aperture 144 or pole piece 112, a gaseous backscattered electron detector, or a solid state backscattered electron detector. An advantage of backscattered detectors is that they can be used when a sample is so hot that the thermionic electron current saturates secondary electron detectors. Thermionic electrons posses low energies and can be suppressed by biasing the sample or an electrode near the sample so as to collect thermionic electrons or return them to the sample surface. This method, however, also suppresses secondary electrons excited by an electron beam because secondary electrons also posses low energy. A solid state detector may be a multi-segment detector that can provide unique topographic information about the sample. The disadvantage of solid state detectors is that they are heat intolerant and comprised of materials that are incompatible with process gases such as $XeF_2$.

An optional heater 180 allows sample 130 to be heated. An insulating platform 182 insulates the heater 180 from the lower part of the cell 140 which is connected to the stage 124. Optional cooling coils 184 can be used to cool the walls of cell 126 when heater 180 is used to heat the sample 130 for thermal processing. Optional cooling coils (not shown) can also be used to cool the lid 146. Cooling can be disabled when the cell is being cleaned. A cell cleaning procedure may be comprised of opening the cell to create a large gap, typically 5 cm, between the lid 146 and the lower part 140 of the cell whilst the chamber 122 is being pumped by vacuum pump 162 and heating the sample and the heater up to a temperature of, for example, 400° C. so as to enable heating of the cell walls and the lid up to a temperature of, for example, 100° C. The exact cell wall and lid temperatures depend on the heat transfer rate from the heater to the cell walls, the thermal mass of the lid and the cell, and the heat transfer rate from the lid and the cell to the enclosing charged particle beam system 100.

A photon transparent optical window 188 allows a user of the equipment to observe the sample. Optical window 188 can also be used to allow x-rays 190 from the sample to enter an x-ray detector 192 to perform x-ray analysis.

Figure 2:
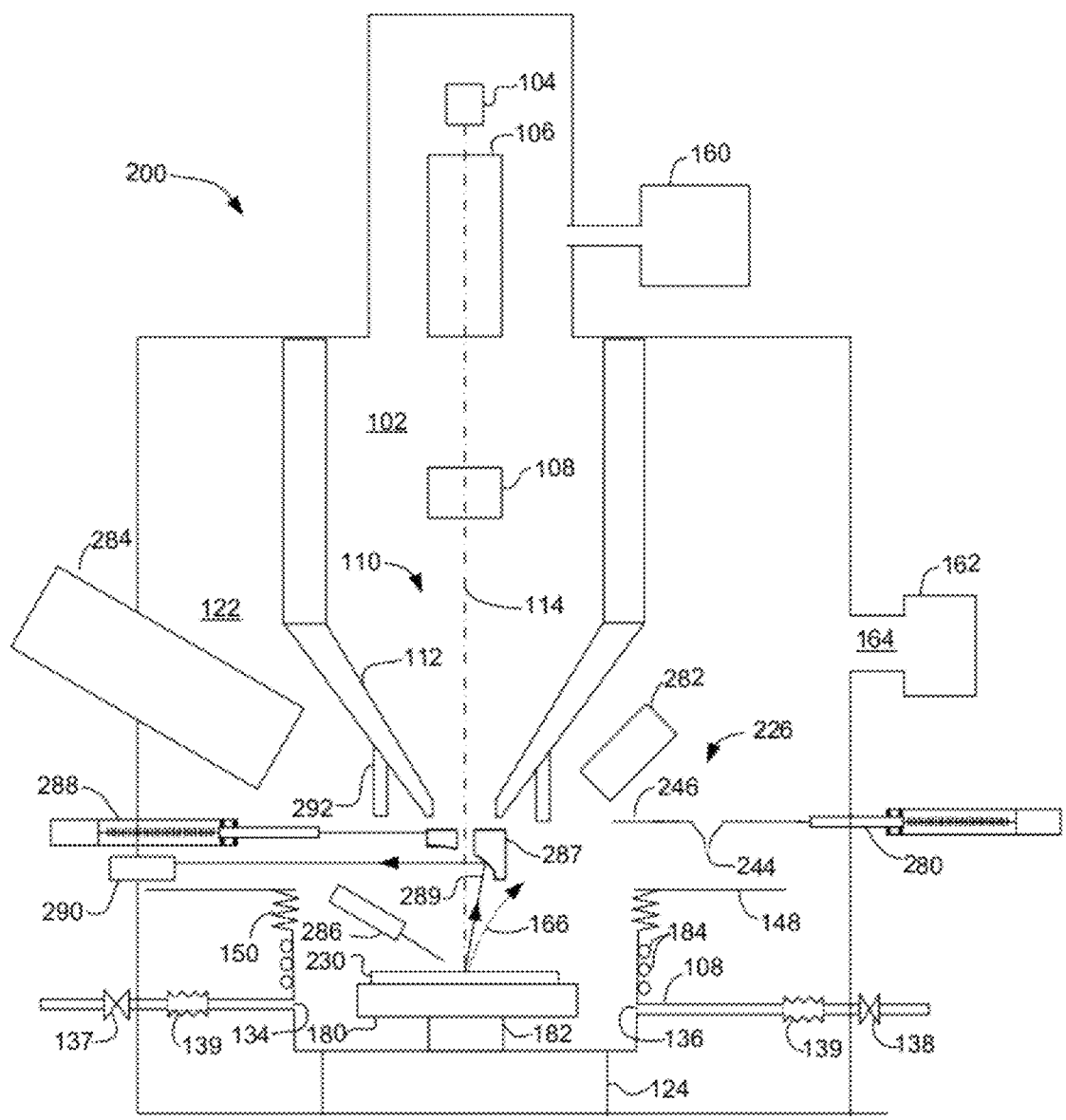
FIG. 2 shows another embodiment of a charged particle beam system of the present invention having an environmental cell with a retractable lid.

In some embodiments, the portion of the cell fixed with respect to the particle optical column can be retracted without opening the evacuable chamber. FIG. 2 shows schematically a charged particle beam 200 system that includes a cell 226 having a retractable lid 246. A retraction mechanism 280 moves the lid 246 from over cell 226 to the retracted position illustrated in FIG. 2. Retraction mechanism 280 can translate the lid 246 along a single axis using an electric or a piezoelectric motor, or a pneumatic switch. Retraction mechanism 280 can preferably place the lid with suitable positional accuracy relative to pole piece 112, for example, to within about 100 µm to align pressure limiting aperture 244 with optical axis 114. The retraction mechanism 280 can include an optional x-y alignment mechanism such as a 2 axis motor or a pair of setscrews to enable alignment of pressure limiting aperture 244 with optical axis 114. With the lid 246 retracted, the microscope can be operated in high vacuum mode using a secondary particle detector 282, such as an Everhart-Thornley detector as described, for example, in U.S. Pub. No. 2008/0308742 for an "In-Chamber Electron Detector." Also with the lid retracted, the sample 230 can be processed by a focused ion beam from focused ion beam column 284. Moreover, with lid 246 retracted, a gas injection system capillary 286 can be inserted toward the sample 230 to apply gas locally for gas-assisted ion beam, gas-assisted electron beam, or localized thermal processing of sample 230. Furthermore, with lid 246 retracted, a light collector such as a parabolic or an elliptical mirror 287 may be inserted and positioned by retraction mechanism 288 to perform cathodoluminescence analysis of sample 230. Light 289 emitted from sample 230 upon impact of the electron beam is reflected by mirror 287 into a detector 290, which may include a monochromator and a photomultiplier tube. Optional lid supports 292 prevent damage to pole piece 112 caused by lid 246 when the cell is raised to create a contact seal between flange 148 and lid 246, and when a sealed cell is translated in the x-y plane using stage 124. Lid 246 can optionally be attached permanently to retraction mechanism 280 whereby the mechanism remains in place after the lid is inserted and the cell is sealed to enable gas flow and sample processing.

Figure 3:
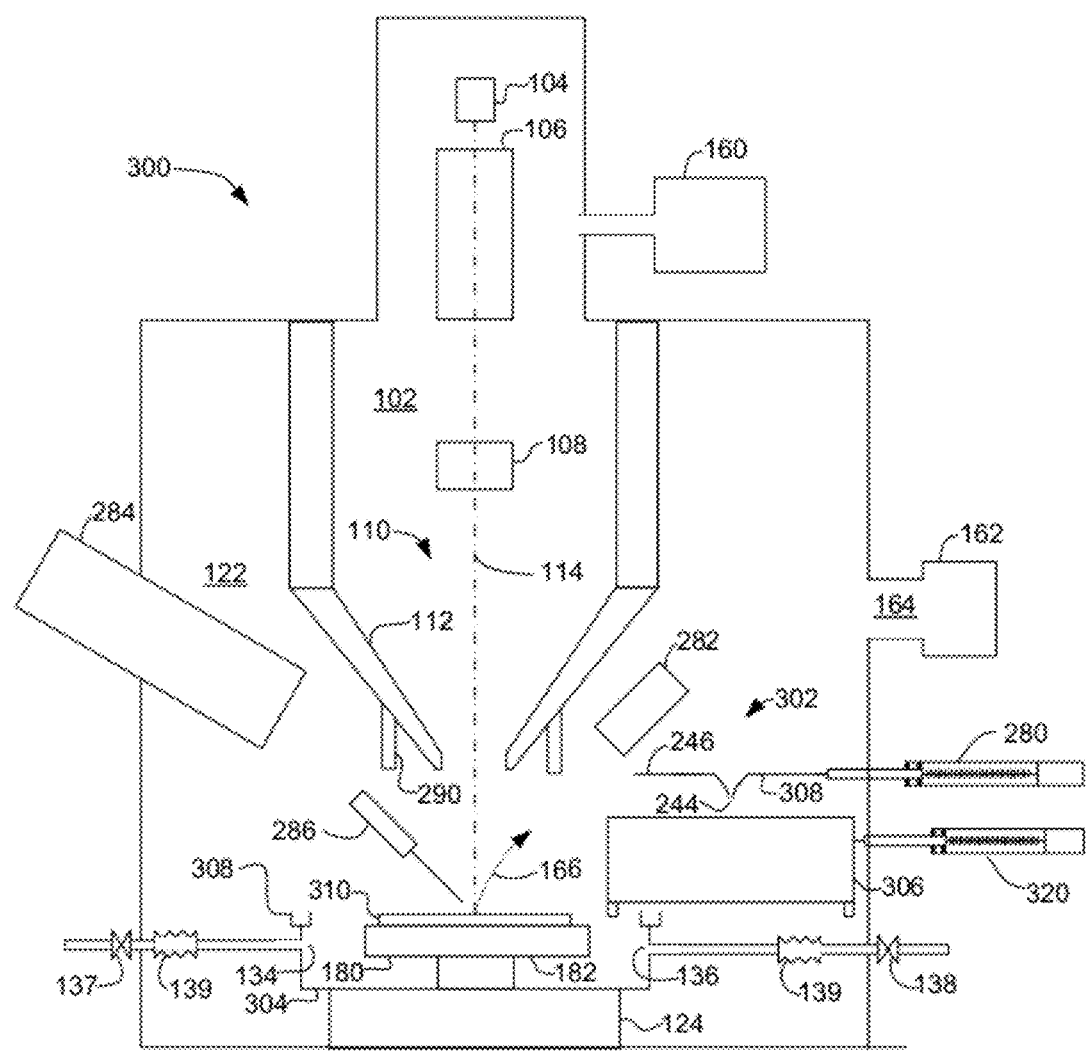
FIG. 3 shows another embodiment of a charged particle beam system of the present invention having a retractable environmental cell.

FIG. 3 shows a charged particle beam system 300 that includes a modular cell 302. Cell 302 includes a cell base 304, cell walls 306, and cell lid 308. One or more of cell walls 306 are shown moved out of the way to enable better access to a sample 310. In one embodiment, cell walls are inserted into a seal 308 in cell base 304. The walls 306 can be removed as a unit by lowering sample stage 124 to lower the base 304 while holding the cell walls in a gripper attached to a retractor mechanism 320, similar to retraction mechanism 280. When the cell walls 306 are free of the seal 308, the cell walls are retracted, similar to retracting lid 246 in system 200. In another embodiment, one or more walls are hinged at the base, and the walls can be rotated on their respective hinges to move the wall out of the way. In the configuration shown, the heater 180 is mounted on insulator 182 on the cell base 304 which is mounted onto the SEM stage 124. Heater 180 can therefore be used without the rest of the cell body and without the lid, thereby enabling cost-effective thermal gas chemistry in a standard SEM or dual beam system.

Another aspect of the invention entails the use of photoelectron yield spectroscopy ("PYS") in high vacuum and high pressure charged particle beam systems. PYS is a surface-sensitive technique and is typically performed in ultra-high vacuum environments. It can, however, also be used to analyze samples in high vacuum environments such as those employed by the sample chambers of most SEM systems. However, the usefulness of PYS in current use SEMs is limited severely by inadequate control of the cleanliness and general state of the sample surface, and an inability to perform high quality thermal processing which requires a high degree of control over the purity and quantity of gases flowing over the sample surface. PYS can also be performed in gaseous environments where the electron emission current is amplified using a gas ionization cascade such as that used in an HPSEM or in any of the embodiments described above. However, as in high vacuum SEM, the usefulness of PYS in current use HPSEM systems is severely limited by inadequate control of the cleanliness and general state of the sample surface, and an inability to perform high quality thermal processing.

In PYS, the electron emission current is measured as a function of the frequency of electromagnetic radiation that impinges on the sample. The total electron yield is measured as a function of the energy of the incident photons. Electron yield can be measured by detecting the electrons emitted from the surface or by measuring the sample current, that is, the current between ground and the sample, which current compensates for the charge of the photoelectrons leaving the surface. Photon energies typically in the range of about 2 eV to about 20 eV yield the photoionization energy, and information on the highest occupied states of the sample. Higher energy photons (e.g., x-rays of up to 10 keV) permit probing of lower lying states in the valence band (i.e., as in the technique EXAFS—extended x-ray absorption fine-structure).

Figure 9:
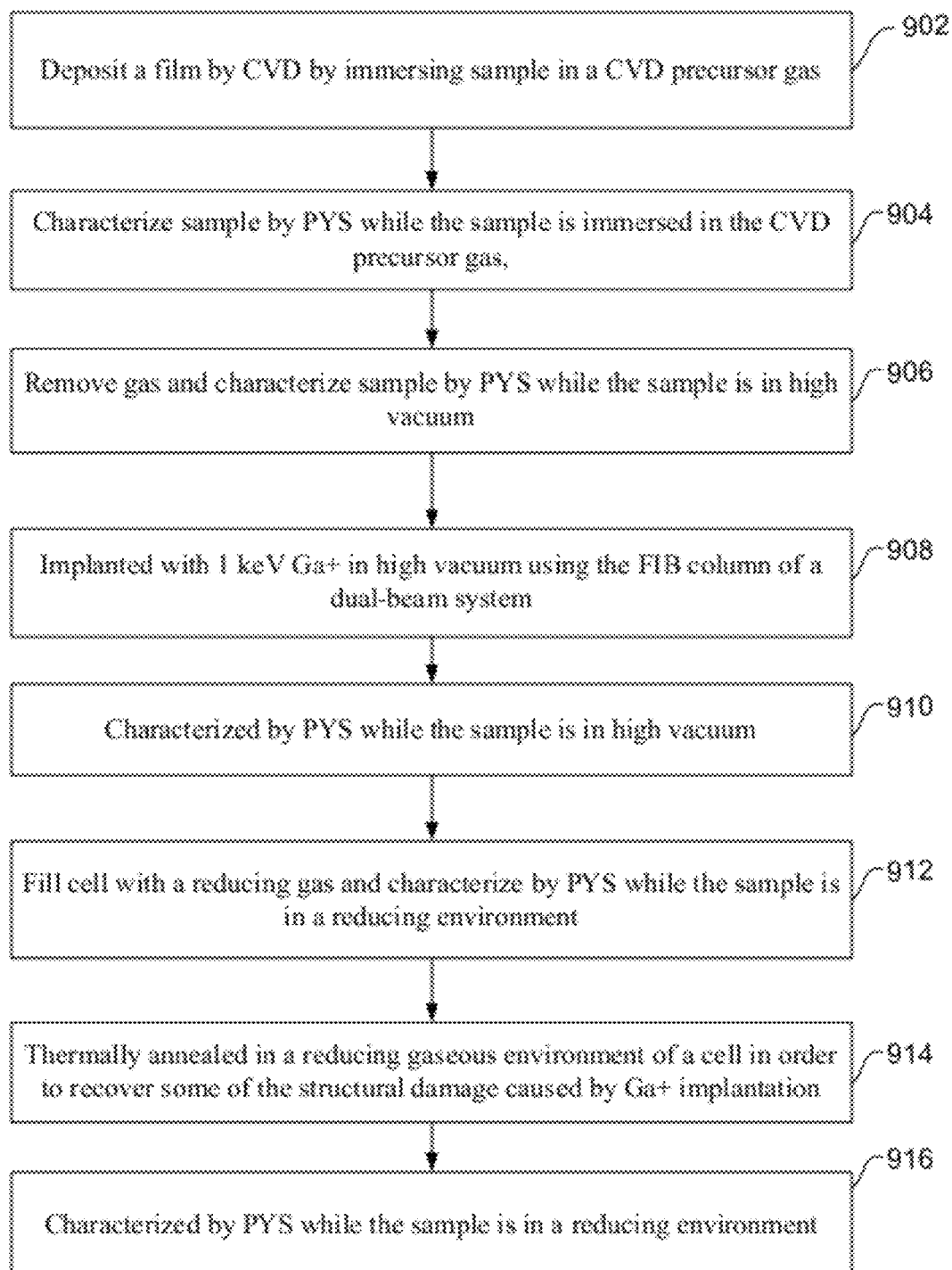
FIG. 9 is a flowchart showing the steps of a method of the invention.

PYS can be used to provide additional information about the sample in an environmental cell or a sample chamber of a charged particle beam, such as an HPSEM. The PYS spectrum of a sample can change when the sample is exposed to gas, or modified by thermal annealing in vacuum or in a gaseous environment. Environmental cells, such as those described in PCT/US2008/053223 and particularly those disclosed herein can be used to improve control of the sample environment by reducing the concentration of gas-phase impurities and adsorbates at the sample surface and thereby facilitate the use of some PYS analysis techniques. A technique such as PYS can be used in conjunction with a sample heater to monitor system cleanliness by monitoring the effects of impurity adsorbates on the sample surface, and to monitor sample modification processes such as thermal annealing in gaseous environments and delocalized dry etching. A baseline PYS spectrum (the "baseline") can be obtained with the sample in a high vacuum using a sample current meter or a secondary electron detector such as a multichannel plate or an Everhart-Thornley detector, though most such high vacuum secondary electron detectors are light-sensitive and as such precautions must be taken to ensure that they are not flooded by the photons used in PYS. Alternatively, the baseline spectrum can be obtained with the sample in an environment of an inert gas such as $N_2$ or Ar that is defined as a reference gas and used as a medium for gas cascade amplification of the photoelectron emission current. An advantage of this approach is that HPSEM detectors such electrode 164 described above are light-insensitive and to not require any additional hardware or modification to serve as HPSEM PYS detectors. The baseline PYS spectrum can be used to determine initial properties of the sample. The baseline can also be used to detect the effects of subsequent system cleaning and sample processing on the sample surface. After the baseline is obtained, the cell can then be evacuated and the sample can be exposed to additional gases, with one or more PYS spectra being obtained between, during or after processing steps. A final spectrum may be taken using the reference gas used to acquire the baseline PYS spectrum. A retractable cell lid such as 246 shown in FIGS. 2 and 3, and a retractable cell body such as 306 shown in FIG. 3 enable complex multi-step processes that require or benefit from PYS analyses performed in both high vacuum and gaseous environments. For example, FIG. 9 shows typical steps for processing a sample. In step 902, a film is deposited on a sample in a cell using CVD. In step 904, the sample is characterized by PYS while the sample is immersed in the CVD precursor gas. In step 906, the CVD precursor gas is removed and the sample is characterized by PYS in a high vacuum. In step 908, the sample is implanted with 1 keV $Ga^+$ in high vacuum using the FIB column of a dual-beam system while the sample is in a high vacuum environment. In step 910, the sample is characterized again by PYS in a high vacuum after gallium implantation. In step 912, the cell is filled with a reducing gas and the sample is characterized by PYS while in the reducing gaseous environment. In step 914, the sample is thermally annealed in a reducing gaseous environment of a cell in order to recover some of the structural damage caused by $Ga^+$ implantation. In step 916, the sample is characterized by PYS in the gaseous reducing environment after annealing in a reducing environment.

In general, PYS can be used for in-situ characterization of dynamic processes such as CVD, dry etching, catalysis, oxidation/reduction/passivation, ion implantation and solid-solid and solid-liquid phase transitions. Samples modified by exposure to controlled gaseous atmospheres, etch agents and/or annealing in a charged particle beam chamber or cell can also be characterized by the invention.

Figure 4:
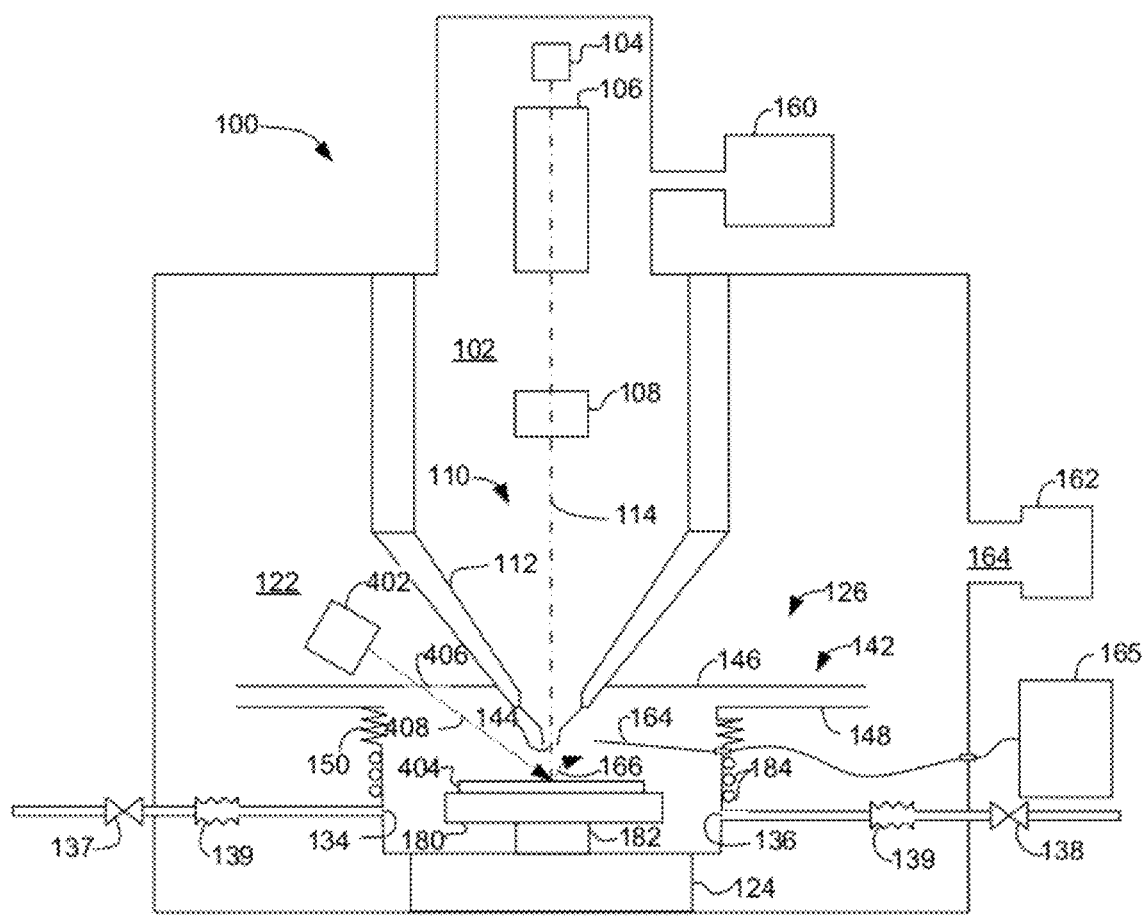
FIG. 4 shows another embodiment of a charged particle beam system of the present invention having an environmental cell and a photon source for photoelectron yield spectroscopy.

FIG. 4 shows schematically a system for performing PYS. The system of FIG. 4 is similar to that of FIG. 1, with the addition of a radiation source 402, such as an ultra violet source or an x-ray source. Radiation from source 402, impinges on sample 404 through window 406, causing sample 404 to give off photoelectrons if the incoming photons have sufficient energy to free an electron. The photoelectrons are amplified by the collision cascade process and detected by detector 164. While FIG. 4 shows PYS being performed in an environmental cell, it could be performed in a sample chamber of an HPSEM.

Incorporation of a photoemission yield system in a HPSEM provides electronic structure information that cannot be obtained by existing HPSEM techniques, and is particularly desirable for HPSEM systems designed for studies of surface modification processes such as thermal annealing in reactive gaseous environments.

The photons provided by source 402 are typically in the form of a convergent beam with a diameter D at the surface of sample 404, configured such that the photon beam does not extend beyond 404. Well focused, high vacuum implementations of the invention, whereby D is smaller than 100 µm and preferably smaller than 10 µm, may be useful for end-pointing of material removal processes performed using a focused ion beam with a liquid metal or a plasma ion source, or a laser implemented on a multi-beam system. The combination of PYS and modular cells such as cell 302 shown in FIG. 3 are particularly suitable for implementation on current use multi-beam systems since cell components such as the lid 308 and walls 306 can be retracted before/after sample 310 is processed in cell 302, so as not to interfere with the operation of a focused ion beam, a laser beam, high vacuum detectors and other components of a multi-beam-system.

Figure 5:
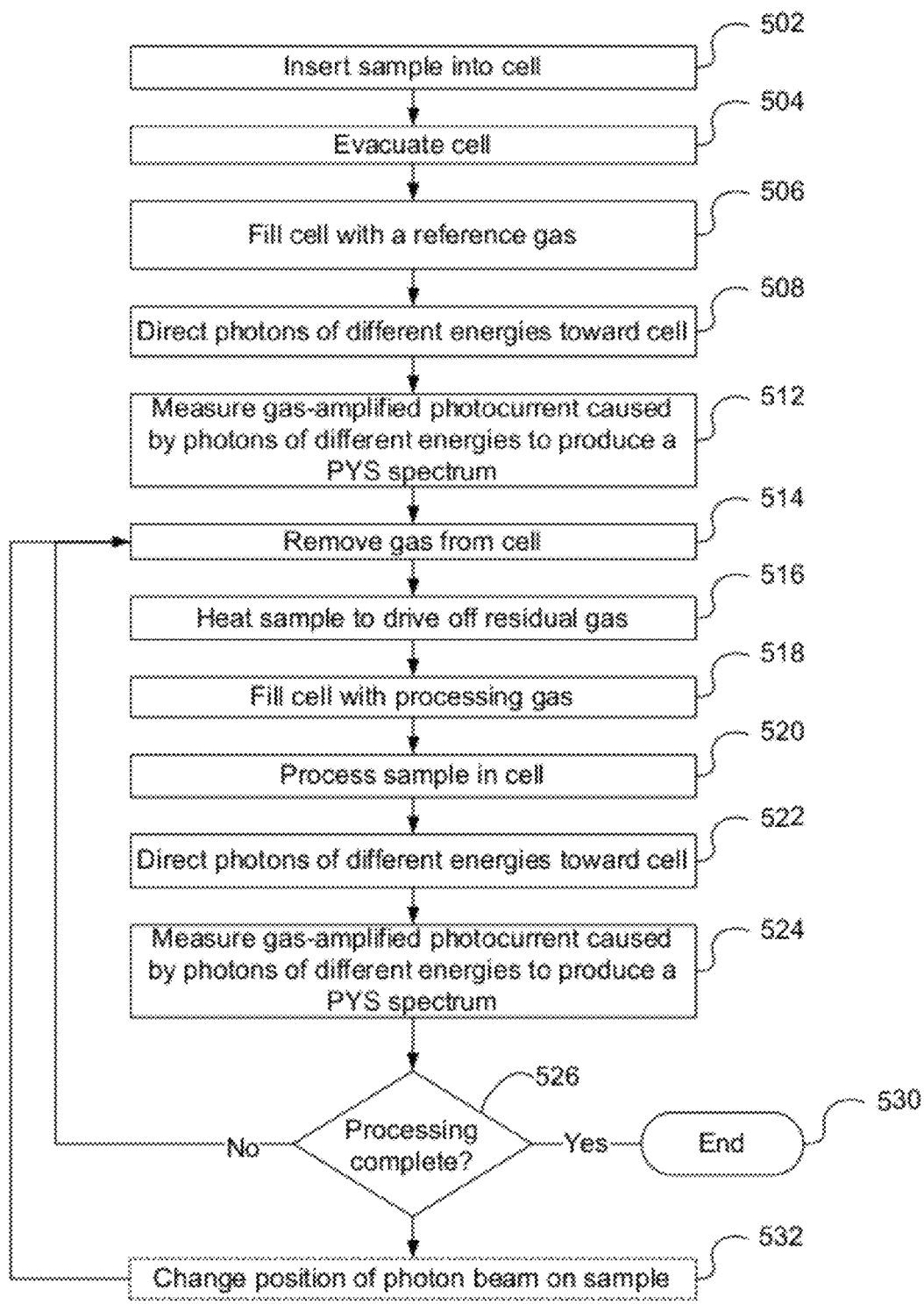
FIG. 5 is a flowchart showing the steps of a method of the invention.

FIG. 5 shows a preferred method of performing PYS in a high pressure charged particle beam system. While the steps of FIG. 5 are described as being performed in an environmental cell, the steps can also be performed in a conventional sample chamber of an HPSEM. In step 502, the sample is positioned in an environmental cell. In step 504, the cell is evacuated. In step 506, the cell is filled with a reference gas that can be used for gas amplification of photoelectrons. Whether the gas has an effect on the sample surface and hence the PYS spectrum will depend on the material comprising the sample. For example, inert gases such as Ar, $N_2$ or He have minimal effect on most material surfaces, whereas a gas such as $O_2$ may be preferred when the sample is an oxide. The gas pressure in the cell will vary with the application, but is typically between 0.1 mbar and 10 mbar. In step 508, photons with energies in the range of about 2 eV up to the ionization threshold of the environmental gas (typically greater than 12 eV) are delivered to the sample. Photons of energy greater than the ionization threshold of the gas can be used, but photoelectrons generated in the gas must be accounted for in the analysis of the PYS spectrum. The photon source 402 is typically located outside the cell, either in the chamber 122 or outside chamber 122 (not shown) and delivered to the sample 404 via optical windows or a fiber optic. Most tunable monochromatic sources are too bulky to be located inside the cell 142.

In step 512, the emitted photoelectrons are amplified by gas cascade amplification and the amplified signal is detected to form a baseline PYS spectrum using a conductive electrode detector, such as a needle or a ring while the energy of the impinging photons is varied through a range. The photoemission current can be used to determine the material present or the state of the material present where the photons struck the surface. The photoemission current is typically measured as a function of photon energy to determine the type of material present and the nature of the sample surface.

As described in Honda et al., "Atmospheric effect of air, $N_2$, $O_2$, and water vapor on the ionization energy of titanyl phthalocyanine thin film studied by photoemission yield spectroscopy," *Journal of Applied Physics* 102 103704 (2007), the photocurrent is typically zero at low photon energies, and increases slowly with energy from an energy designated $I_i$, as electrons in lower original energy levels are freed from the surface. At a point $I_o$, corresponding to a radiation energy sufficient to remove unexcited outer shell electrons, the photoelectron current starts to increase more rapidly with energy. At higher energies, the dependence of the photoelectron current on beam energy is a function of details of the electronic structure of the sample surface.

In step 514, the gas that was used to determine the baseline PYS spectrum is removed from the cell and the sample may be heated in step 516 to drive off any residual gas adsorbed onto the sample. After a baseline spectrum has been established in step 512, and the reference gas has been removed in steps 514-516, the cell is filled in step 518 with a process gas. The sample is then processed in step 520. Processing can include thermally induced processes, such as thermal annealing in a reactive gaseous environment, CVD, or charged particle beam induced processing, such as electron beam-assisted etching or deposition. Thermal annealing in gases such as $O_2$, $H_2$, $NH_3$ or $XeF_2$ can give rise to oxidation, reduction, or dry etching of different materials. CVD processing can include, for example, deposition of silicon, germanium, carbon, tungsten or silicon oxide using silane, germanium tetrachloride, ethanol, tungsten hexafluoride or TEOS, respectively.

PYS can be used to monitor the processing to determine when it is complete, when it has initiated, for example in an experiment where the sample temperature is increased until a change in the surface electronic structure is detected, or PYS can be used after processing to analyze the results. During or after processing, the PYS spectrum is measured again by directing photons toward the sample in step 522 and measuring the gas cascade amplified photocurrent in step 524. Steps 522 and 524 can be performed after processing of step 520 is complete or while the sample is being processed. That is, consecutive PYS spectra can be collected as a function of time during processing. Alternatively, the photoemission current excited using a fixed photon energy can be measured as a function of time during processing. As the sample surface changes during processing, the photocurrent will change as the surface composition changes, and PYS can be used for determining when processing in step 520 is complete.

The PYS spectrum can be measured using the process gas for gas amplification, or the process gas can be removed and the spectrum can be measured using a different gas. When processing is determined to be complete in decision block 526, the process is ended as shown at terminal block 530.

The spatial resolution of the PYS spectrum is defined by the area illuminated by the photons. While the spatial resolution is not critical for many applications of interest, in applications where spatial resolution is important, the photons can be focused to a small spot and the spectrum from the small region illuminated by the photon spot can be obtained. The illuminated spot on the sample surface can be moved in optional step 532. For example, the focal point can be rastered to create a map of the surface. The map can be a spectral map whereby a PYS spectrum is acquired at each pixel. The spatial resolution can be optimized using a focused laser beam and near field optics.

Steps 514-524 can be repeated to measure the spectrum after exposure to as many different gases as desired, with or without processing between exposures.

Figure 6:
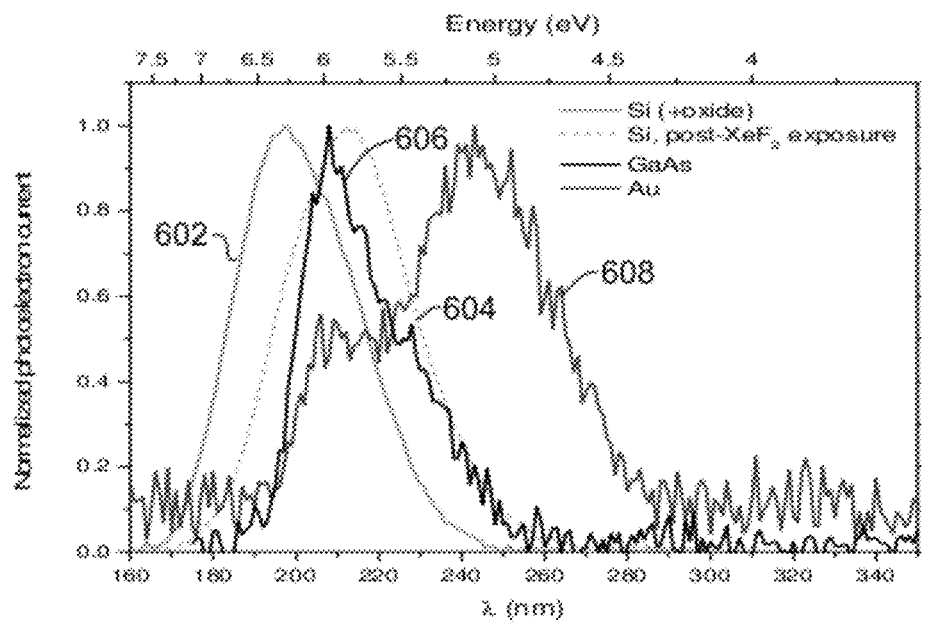
FIG. 6 shows gas amplified PYS spectra of silicon with a native oxide layer, silicon etched by $XeF_2$ to remove the oxide layer, gallium arsenide, and gold.

FIG. 6 shows sample PYS spectra obtained using gas cascade amplification. Graph 602 shows the spectrum of a silicon sample having a native oxide layer. Graph 604 shows the spectrum of a silicon sample after exposure to $XeF_2$, which removes the oxide layer. Oxide removal is often a preliminary step before depositing a layer, for example, by CVD. Graph 606 shows a PYS spectrum of a gallium arsenide sample and graph 608 shows the PYS spectrum of a gold sample.

Figure 7:
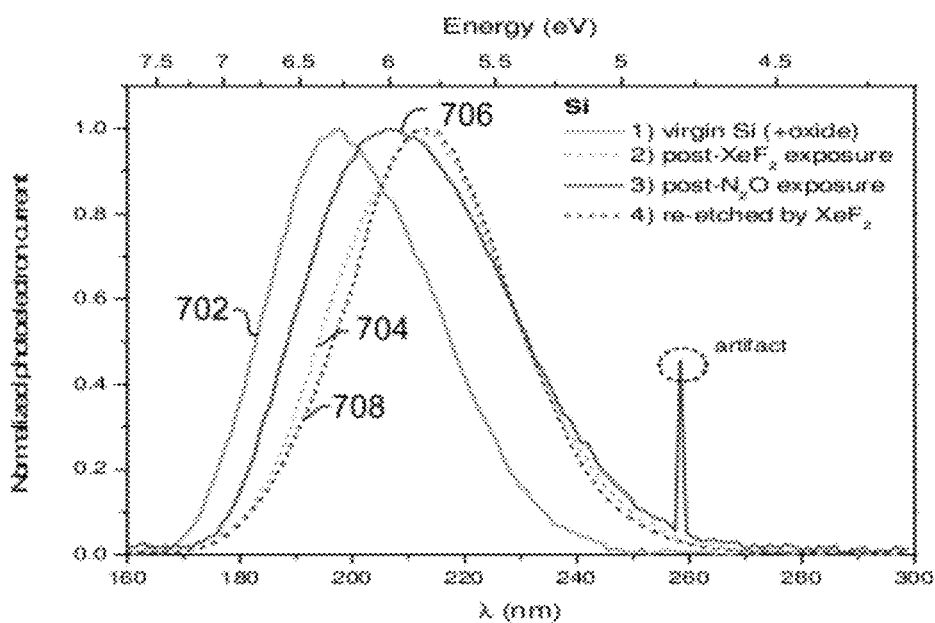
FIG. 7 shows gas amplified PYS spectra of silicon annealed in atmosphere, exposed to $XeF_2$, exposed to $N_2O$ and then reexposed to $XeF_2$.

FIG. 7 shows PYS spectra obtained using gas cascade amplification of a silicon sample undergoing sequential processing. Graph 702 shows the spectrum of a silicon sample having a native oxide layer. Graph 704 shows the spectrum of the silicon sample after exposure to $XeF_2$, which would remove the oxide layer. Graph 706 shows a PYS spectrum of the silicon sample after exposure to $N_2O$ which creates a new oxide layer, and graph 608 shows the PYS spectra of the sample after re-exposure to $XeF_2$ to remove the new oxide layer. The data for the graphs in FIGS. 6 and 7 were obtained in an ex situ cell using gas cascade amplification of the photoelectrons. The spectra are not corrected for the frequency response of the light source and the light delivery system.

Figure 10:
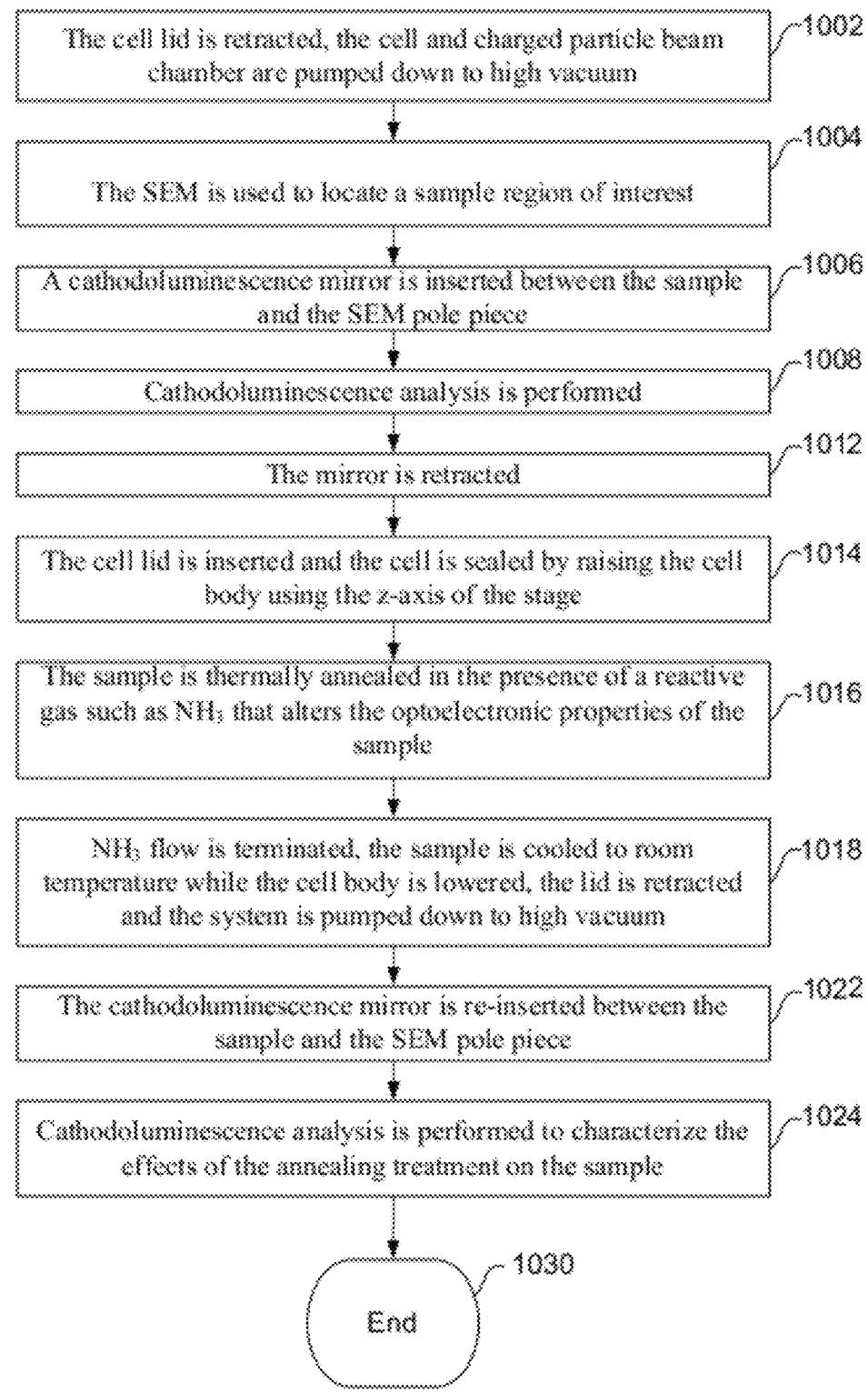
FIG. 10 is a flowchart showing the steps of a method of the invention.

As described above, another analytical technique that can be performed in a cell is cathodoluminescence. A typical process is described in FIG. 10. In step 1002, the cell lid is retracted and the cell and charged particle beam chamber are pumped down to high vacuum. In step 1004, the SEM is used to locate a sample region of interest. In step 1006, a cathodoluminescence mirror is inserted between the sample and the SEM pole piece. In step 1008, cathodoluminescence analysis is performed. In step 1012, the mirror is retracted, and in step 1014, the cell lid is inserted and the cell is sealed by raising the cell body using the z-axis of the stage. In step 1016, the sample is thermally annealed in the presence of a reactive gas such as $NH_3$ that alters the optoelectronic properties of the sample. In step 1018, $NH_3$ flow is terminated, the sample is cooled to room temperature while the cell body is lowered, the lid is retracted and the system is pumped down to high vacuum. In step 1022, the cathodoluminescence mirror is re-inserted between the sample and the SEM pole piece, and in step 1024, cathodoluminescence analysis is performed to characterize the effects of the annealing treatment on the sample, and the process ends in block 1030. Optionally, the sample may be cooled below room temperature during cathodoluminescence analysis, for example using a liquid nitrogen cooler integrated into the sample holder and the sample heater. Cooling significantly improves cathodoluminescence analysis of many materials by suppressing phonon-mediated relaxation pathways. The workflow of FIG. 10 has the benefits that a given sample region can be analyzed before and after thermal annealing in a reactive environment without exposing the sample to atmosphere and without the need for sample registration and vacuum transfer mechanisms. It is particularly beneficial and well suited to complex processes that require cathodoluminescence analysis to be performed before and after multiple process steps such as thermal annealing performed as a function of gas type and sample temperature.

Figure 8A:
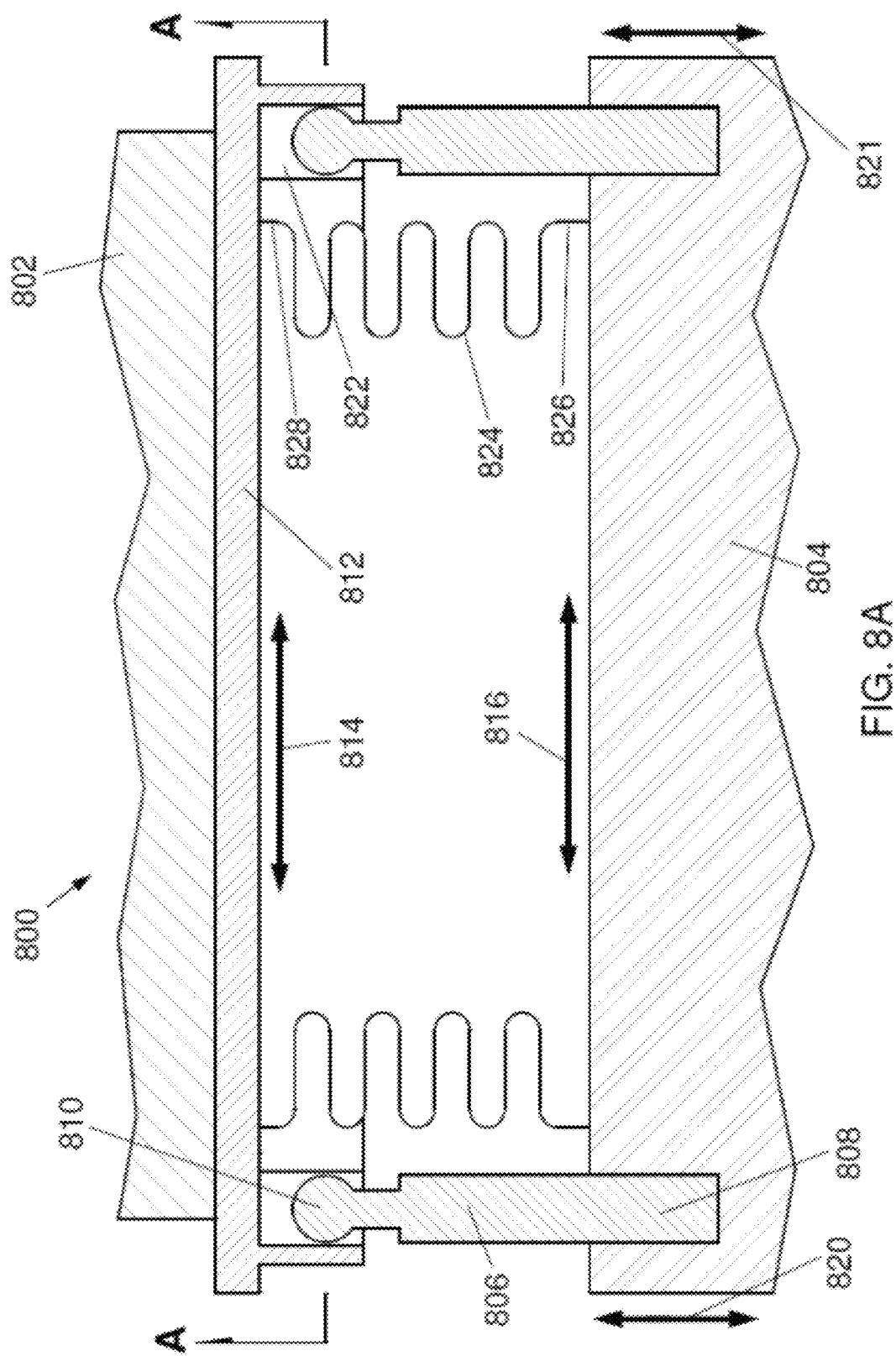
FIG. 8A shows details of a preferred embodiment of an environmental cell.
Figure 8B:
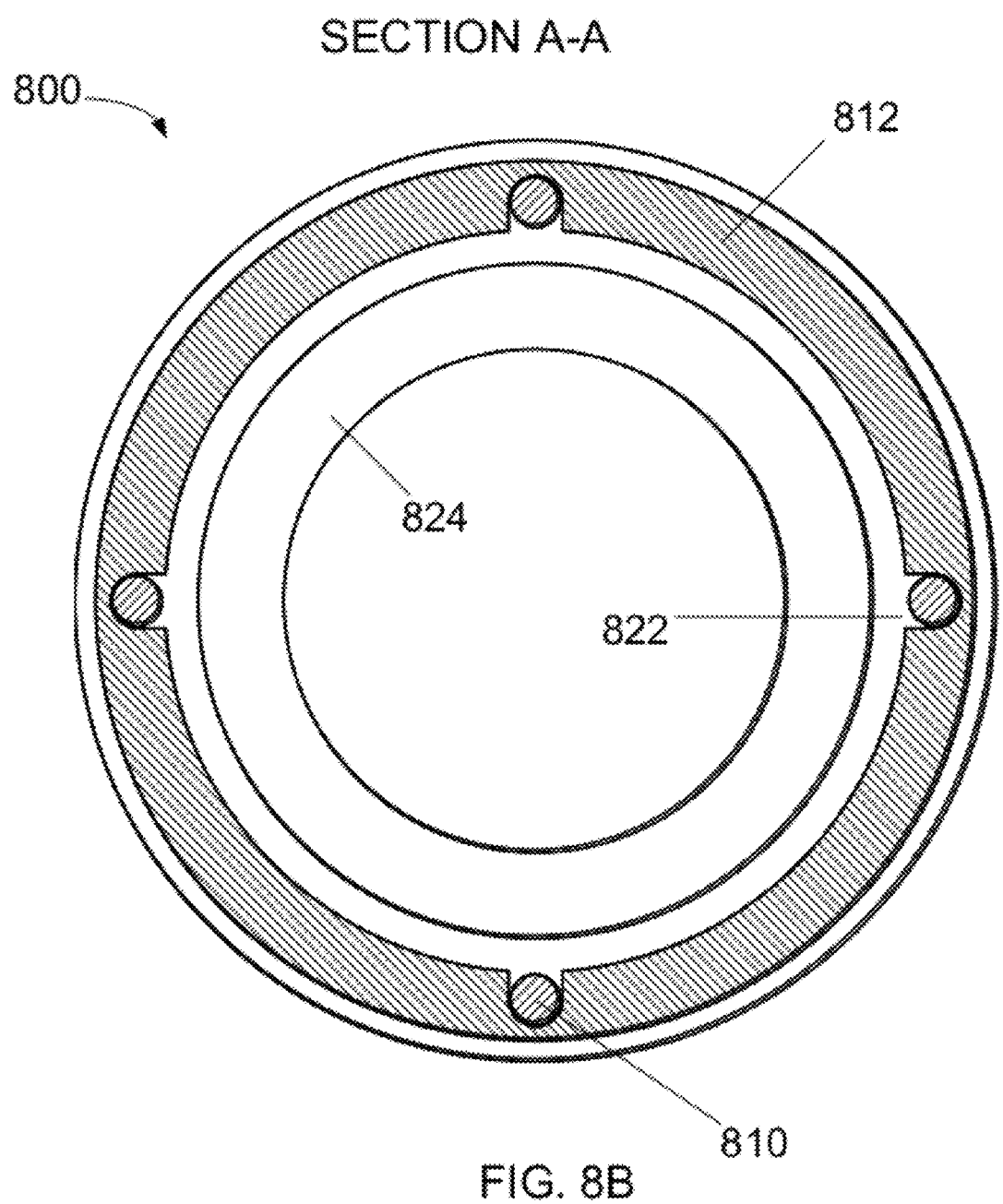
FIG. 8B shows a cross section taken from FIG. 8A.

FIGS. 8A and 8B are schematic illustrations of a preferred embodiment of an environmental cell 800, such as cell 126 in FIG. 1. The upper end 828 of bellows 824 is rigidly attached to the flange 812, such as flange 148 in FIG. 1. The lower end 826 of bellows 824 is rigidly attached to the base 804, such as lower part 140 of cell 126 in FIG. 1. Using the x-y-z axis definitions from FIG. 1, it is well-known in the art that bellows 824 may easily allow three-degrees of motion of the upper end 828 to the lower end 826 of bellows 824. These three degrees of motion consist of z motions (compression or extension of the bellows along the z-axis), as well as rotations about the x-axis and y-axes. Typically, rotational motions of the upper end 828 relative to the lower end 826 around the z-axis are highly undesirable and may lead to breakage of welds within the bellows 824. Small x-y motions of one the upper end 828 relative to the lower end 826 are also possible, but may require large forces relative to the forces required for the preferred three degrees of freedom. Thus to avoid damage to the bellows and undesirable large forces between the cell and the column, it is desirable to configure the environmental cell 800 to allow the three preferred degrees of freedom, while preventing any twisting of the bellows around the z-axis and minimizing any x-y motions of one end relative to the other. FIG. 8A is a side cross-sectional schematic view of a pin mechanism which limits the motions of the bellows 824 to the preferred three degrees of freedom. FIG. 8B is a top cross-sectional view A-A (see FIG. 8A) of the environmental cell 800 from FIG. 8A. Flange 812, such as flange 148 in FIG. 1, has been configured with a multiplicity of N pockets 822, where typically N≥3, and FIG. 8B illustrates the case of N=4. The same number, N, of pins 806 are rigidly attached at their lower ends 808 to the cell base 804. The upper ends of pins 806 comprise ball ends 810, each with a sliding fit into one of the pockets 822 in the flange 812. Pins 810 fit loosely into pockets 822, permitting vertical relative motions 820 and 821 of the flange 812 relative to the base 804—these motions comprise vertical z-axis motions, as well as rotations about the x- and y-axes. The x-y motions and z-axis rotation of the flange 812 relative to the base 804 are largely prevented by the largely vertical motion of the balls 810 in the pockets 822. The required x-y motions of the base relative to the lid 802 are enabled by the sliding seal between the flange 812 and the lid 802, as in FIG. 1. When the stage (not shown), such as stage 124 in FIG. 1 translates the cell 800 along the x- and y-axes, the pins 806 ensure that the motion 816 within the x-y plane of the base 804 matches the motion 814 within the x-y plane of the flange 812. Relative z-axis motions and tilts about the x- and y-axes are permitted by the independent vertical motions 820 and 821 of each ball 810 within their corresponding pocket 822.

Embodiments of the invention provide in-situ processing and analysis techniques in addition to conventional SEM/HPSEM imaging and analysis for use in a charged particle system. Such additions can improve the versatility and value of such HPSEM systems for research and nanoprototyping tools by providing novel characterization capabilities to HPSEM systems.

To the extent that any term is not specially defined in this specification, the intent is that the term is to be given its plain and ordinary meaning. The accompanying drawings are intended to aid in understanding the present invention and, unless otherwise indicated, are not drawn to scale.

The invention has multiple inventive aspects and broad applicability, and can provide many benefits as described and shown in the examples above. The embodiments will vary greatly depending upon the specific application, and not every embodiment will provide all of the benefits and meet all of the objectives that are achievable by the invention. Some of the claims, as attached hereto or as amended during prosecution, may cover less than all the embodiments of the invention described.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle beam system, comprising:
a source of charged particles;
a particle optical column for producing a focused beam of particles and directing the beam toward the sample, the particle beam optical column having an optical axis;
an evacuable sample chamber;
a motion stage positioned in the evacuable chamber, the motion stage movable relative to the optical axis;
a cell located within the evacuable chamber for containing a sample for processing, the cell including:
a first portion of the cell having a body forming an enclosure, the first portion positioned on the motion stage and movable with the motion stage
at least one gas inlet formed in the first portion for introducing gas into the cell;
a second portion of the cell including a radially outwardly extending member fixed with respect to the particle optical column, wherein the body of the first portion and the radially outwardly extending member of the second portion of the cell oppose each other to create a seal during motions of the stage, the seal formed by a first radially outwardly extending flat surface on the radially outwardly extending member and a second flat surface that extends radially outwardly from the first portion of the cell, the two flat surfaces opposing each other to form the seal that reduces gas flow from the cell interior to the evacuable chamber; and
a flexible bellows formed in the first portion to allow vertical movement between the first portion and the second portion, the flexible bellows having sufficient stiffness to provide enough pressure between the second flat surface and the first flat surface to maintain a contact seal, while still allowing relative motion between the first and second portions of the cell.

2. The charged particle beam system of claim 1 in which the first flat surface is mounted onto a lens of the particle optical column.

3. The charged particle beam system of claim 1 in which the first flat surface and the second flat surface comprise stainless steel, aluminum or a fluoropolymer such as polytetrafluoroethylene.

4. The charged particle beam system of claim 1 in which the first flat surface and the second flat surface seal without the use of an elastomer.

5. The charged particle beam system of claim 1 in which the seal is a contact seal.

6. The charged particle beam system of claim 1 in which the seal is a gap of less than 1 mm.

7. The charged particle beam system of claim 1 in which the cell includes a photon transparent window.

8. The charged particle beam system of claim 1 in which the portion of the cell fixed with respect to the particle optical column can be retracted without opening the evacuable chamber.

9. The charged particle beam system of claim 8 further comprising a radiation detector for detecting radiation emitted from the sample upon impact of the electron beam.

10. The charged particle beam system of claim 9 in which the radiation detector detects x-rays for x-ray analysis or light for luminescence analysis.

11. The charged particle beam system of claim 1 in which the cell includes a heater for heating the sample.

12. The charged particle beam system of claim 11 which includes a cooler to cool the portion of the cell positioned on the stage.

13. The charged particle beam system of claim 1 in which the cell includes a cooler to cool the sample.

14. The charged particle beam system of claim 1 further comprising a radiation source capable of irradiating the sample with radiation over a sufficient range of frequencies to produce a photoluminescence spectrum or a photoelectron yield spectrum.

15. The charged particle beam system of claim 1 in which the cell further includes within the cell a detector electrode for detecting an electron signal from the sample amplified by gas cascade amplification and in which the charged particle system further includes a photon detector within the evacuable sample chamber and outside the cell.

16. A method of charged particle beam processing, comprising:
   providing a charged particle beam system having;
      an evacuable chamber;
      a motion stage;
      a focusing column; and
      an optical axis;
   providing an environmental cell, positioned inside the evacuable chamber, for processing the sample in a gaseous environment, the environmental cell having a first part forming an enclosure with a first radially outwardly extending flange having a first flat surface, the flange connected to the motion stage and positioned on the motion stage and a second part including a second outwardly extending flange having a second flat surface that opposes the first outwardly extending flange to create a pressure limiting aperture for the cell that reduces gas flow from the cell interior to the evacuable chamber; moving the stage while maintaining the pressure limiting aperture fixed relative to the optical axis by applying pressure from the first flat surface to the second flat surface using a flexible bellows formed in the first part to allow vertical movement between the first part and the second part, the flexible bellows having sufficient stiffness to provide sufficient pressure between the second flat surface and the first flat surface to maintain a contact seal, while still allowing relative motion between the first and second portions of the cell; and
   directing the charged particle beam towards the sample.

17. The method of claim 16 in which moving the stage includes lowering the environmental cell so as to enable opening and closing of the cell within the chamber by separating the sealing portion of the environmental cell from the sealing member.

18. The method of claim 17 further comprising inserting a photon collector between the cell and the focusing column, and using the photon collector to direct photons emitted by the sample to a detector.

19. The method of claim 18 in which the photons are excited by the charged particle beam.

20. The method of claim 18 further comprising heating the sample in a gaseous environment, and collecting photons before and after a sample is processed in a gaseous environment.

21. The method of claim 20 further comprising cooling the sample below room temperature while the detector is used to collect photons emitted from the sample.

22. A charged particle beam system, comprising:
   a source of charged particles;
   an evacuable sample chamber;
   a particle optical column for producing a focused beam of particles and directing the beam toward a sample in an environmental cell in the evacuable sample chamber;
   a photoelectron yield spectroscopy (PYS) photon source capable of directing photons in a single convergent beam scanned over a range of frequencies to produce a PYS spectrum by causing the sample to emit photoelectrons at the different frequencies over the range of frequencies; and
   an electrode for detecting a secondary electron signal due to the impact of the charged particles onto the sample or for detecting the photoelectron signal after the secondary electron signal or the photoelectron signal is amplified in a gas cascade to form a PYS spectrum including the scanned frequencies.

23. The charged particle beam system of claim 22 in which the electrode is connected to the sample or the stage to detect current flowing through the sample or the stage as a measure of the photoelectron emission current.

24. The charged particle beam system of claim 22 in which the radiation source is a laser.

25. The charged particle beam system of claim 22 in which the radiation source is capable of supplying photons scanned over a range of energies between about 2 eV and about 10 eV.

26. The charged particle beam system of claim 22 further comprising a gas source to provide gas to the evacuable sample chamber.

27. The charged particle beam system of claim 22 in which:
   the electrode is positioned within the environmental cell;
   the radiation source is positioned outside the environmental cell; and
   the environmental cell includes a feed-through that admits the radiation to the sample.

28. The charged particle beam system of claim 22 in which the environmental cell includes a retractable lid and the electrode is used to detect the photoelectron signal when the lid is retracted.

29. The charged particle beam system of claim 22 further comprising a radiation guide for guiding the radiation from the radiation source toward the sample.

30. A method of processing a sample in a charged particle beam system, comprising:
   providing a charged particle beam system including a motion stage and a focusing column, the focusing column capable of directing a beam of charged particles towards a sample on the motion stage; and
   providing an evacuable chamber for containing the motion stage, the evacuable chamber containing a sealable cell on the motion stage, the sealable cell having a gas inlet for providing a gaseous environment for the sample in the sealable cell;
   evacuating the evacuable chamber;
   characterizing the sample surface by scanning photons over a range of frequencies sufficient to provide a photoelectron yield spectrum over the sample surface, the sample being in vacuum;
   sealing the sealable cell and providing a gas in the sealable cell;
   reacting the gas with the sample surface within the sealable cell to alter the sample surface;
   unsealing the sealable cell;
   evacuating the evacuable chamber;

characterizing the altered sample surface by scanning photons over a range of frequencies sufficient to provide a photoelectron yield spectrum over the sample surface, in which characterizing the sample surface, reacting the gas, and characterizing the altered sample surface are performed without removing the sample from the evacuable chamber.

31. The method of claim 30 in which characterizing the altered sample surface further comprises measuring a photoelectron signal from the sample caused by the scanned photons by applying a voltage to an electrode detector to detect a signal including photoelectrons emitted from the sample and amplified by the gas cascade amplification, wherein the detected signal is used to determine a characteristic of the sample surface.

32. The method of claim 31 in which determining a characteristic of the sample includes determining whether the process of reacting the gas with the sample surface is complete and, if so, ceasing processing.

33. The method of claim 30 further comprising providing an energy source for reacting the gas in the evacuable chamber with the sample surface by heating the sample.

34. The method of claim 30 further comprising providing an energy source for reacting the gas in the evacuable chamber with the sample surface by directing a charged particle beam toward the sample surface.

35. The method of claim 30 in which characterizing the sample surface by scanning a charged particle beam over a region of the sample surface or scanning photons over a range of frequencies sufficient to provide a photoelectron yield spectrum, comprises scanning a charged particle beam over the surface and detecting cathodoluminescence from the sample.

36. The method of claim 30 in which characterizing the sample surface by scanning a charged particle beam over a region of the sample surface or scanning photons over a range of frequencies sufficient to provide a photoelectron yield spectrum, comprises scanning photons over the surface and detecting photoluminescence from the sample.

37. The method of claim 16 further comprising:
providing within the environmental cell a chemical vapor deposition (CVD) gas;
depositing a film by CVD by immersing sample in a CVD precursor gas in the environmental cell and providing energy to react the CVD gas with the sample surface;
directing photons in a single convergent beam scanned at multiple frequencies below the ionization threshold of the environmental gas causing the sample in the CVD gas in the environmental chamber to emit photoelectrons characterizing the sample, the photoelectrons being amplified by the gas cascade amplification, the detected signal is used to determine a characteristic of the sample surface;
evacuating gas from the cell; and
directing photons in a single convergent beam scanned at multiple frequencies causing the sample in vacuum to emit photoelectrons characterizing the sample, the photoelectrons being detected by a secondary electron detector to determine a characteristic of the sample surface.

38. The charged particle beam system of claim 8 further comprising:
a detector electrode positioned within the cell for detecting an electron signal from the sample amplified by gas cascade amplification; and
an secondary electron detector positioned within the evacuable sample chamber and outside the cell to detect secondary electrons when the portion of the cell fixed with respect to the particle optical columns retracted, allowing the system to operate with the sample in a gaseous environment using the detector electrode or to operate in a high vacuum using the secondary electron detector.

39. The charged particle beam system of claim 38 in which the secondary electron detector is an Everhart-Thornley detector or a multi-channel plate.

40. The charged particle beam system of claim 22 in which the PYS photon source produces photons in the range of about 2 eV up to the ionization threshold of the environmental gas towards the sample in the evacuable sample chamber.

* * * * *